United States Patent
Sobue

(10) Patent No.: US 11,152,346 B2
(45) Date of Patent: Oct. 19, 2021

(54) SEMICONDUCTOR INTEGRATED CIRCUIT DEVICE INCLUDING CAPACITIVE ELEMENT USING VERTICAL NANOWIRE FIELD EFFECT TRANSISTORS

(71) Applicant: Socionext Inc., Kanagawa (JP)

(72) Inventor: Isaya Sobue, Kanagawa (JP)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 17/093,400

(22) Filed: Nov. 9, 2020

(65) Prior Publication Data

US 2021/0082902 A1 Mar. 18, 2021

Related U.S. Application Data

(63) Continuation of application No. PCT/JP2019/018404, filed on May 8, 2019.

(30) Foreign Application Priority Data

May 22, 2018 (JP) .............................. JP2018-097948

(51) Int. Cl.
*H01L 27/01* (2006.01)
(52) U.S. Cl.
CPC .................................. *H01L 27/016* (2013.01)
(58) Field of Classification Search
CPC . H01L 27/016; H01L 29/0676; H01L 27/092; H01L 21/823871; H01L 21/823885; H01L 29/775; H01L 29/94; B82Y 10/00
See application file for complete search history.

(56) References Cited

U.S. PATENT DOCUMENTS

| 4,929,989 | A | 5/1990 | Hayano |
| 10,217,674 | B1* | 2/2019 | Hook ..................... H01L 27/088 |
| 10,325,821 | B1* | 6/2019 | Hook ..................... H01L 23/535 |
| 10,707,354 | B2* | 7/2020 | Shimbo .............. H01L 29/0673 |

(Continued)

FOREIGN PATENT DOCUMENTS

| JP | H1-283863 A | 11/1989 |
| JP | H08-306870 A | 11/1996 |

(Continued)

OTHER PUBLICATIONS

International Search Report issued in corsponding International Patent Application No. PCT/JP2019/018404, dated Jun. 25, 2019, with partial translation.

*Primary Examiner* — John P. Dulka
(74) *Attorney, Agent, or Firm* — McDermott Will & Emery LLP

(57) ABSTRACT

A capacitive element using VNW FETs is provided. First and second components each constituting a transistor are arranged in an X direction. From the first component, a first gate interconnect extends away from the second component, and a first top interconnect and a first bottom interconnect extend toward the second component. From the second component, a second gate interconnect extends toward the first component, and a second top interconnect and a second bottom interconnect extend away from the first component. The first top interconnect, the first bottom interconnect, and the second gate interconnect are connected.

10 Claims, 28 Drawing Sheets

(56) References Cited

U.S. PATENT DOCUMENTS

| | | | |
|---|---|---|---|
| 10,840,263 B2* | 11/2020 | Hino | H01L 29/42392 |
| 11,031,394 B1* | 6/2021 | Or-Bach | H01L 27/0886 |
| 2009/0240451 A1 | 9/2009 | Leroux | |
| 2010/0032741 A1 | 2/2010 | Ueno | |
| 2010/0155702 A1* | 6/2010 | Wernersson | H01L 27/088 |
| | | | 257/24 |
| 2011/0269291 A1 | 11/2011 | Ueno | |
| 2011/0310684 A1 | 12/2011 | Yamagami | |
| 2015/0364366 A1* | 12/2015 | Kim | H01L 27/10814 |
| | | | 438/396 |
| 2015/0380548 A1* | 12/2015 | Wang | H01L 27/0688 |
| | | | 257/329 |
| 2016/0240533 A1* | 8/2016 | Oxland | H01L 29/7827 |
| 2016/0268244 A1* | 9/2016 | Young | H01L 21/76895 |
| 2017/0278927 A1* | 9/2017 | Li | H01L 27/10805 |
| 2018/0122793 A1* | 5/2018 | Moroz | H01L 29/4238 |
| 2018/0175034 A1* | 6/2018 | Goktepeli | H01L 21/76895 |
| 2019/0057959 A1* | 2/2019 | Or-Bach | H01L 27/14634 |
| 2019/0190500 A1* | 6/2019 | Quelen | G05F 3/205 |
| 2020/0144264 A1* | 5/2020 | Li | H01L 23/5226 |
| 2020/0321254 A1* | 10/2020 | Sobue | H01L 21/823487 |
| 2020/0335488 A1* | 10/2020 | Iwahori | H01L 29/7827 |
| 2020/0343185 A1* | 10/2020 | Chang | H01L 27/0207 |
| 2020/0350439 A1* | 11/2020 | Iwahori | H01L 29/78642 |
| 2021/0020571 A1* | 1/2021 | Okamoto | H03K 17/6872 |
| 2021/0104462 A1* | 4/2021 | Lee | H01L 25/0657 |
| 2021/0167056 A1* | 6/2021 | Or-Bach | H01L 25/18 |
| 2021/0184035 A1* | 6/2021 | Tanaka | H01L 27/088 |
| 2021/0202498 A1* | 7/2021 | Liaw | H01L 21/823871 |
| 2021/0217747 A1* | 7/2021 | Kuraguchi | H01L 29/2003 |

FOREIGN PATENT DOCUMENTS

| | | |
|---|---|---|
| JP | 2007-258757 A | 10/2007 |
| JP | 2008-205168 A | 9/2008 |
| JP | 2008-258533 A | 10/2008 |
| JP | 2009-231841 A | 10/2009 |
| JP | 2010-40797 A | 2/2010 |
| JP | 2010-206054 A | 9/2010 |

* cited by examiner

32 COMPONENTS CONNECTED IN PARALLEL

SEMICONDUCTOR INTEGRATED CIRCUIT DEVICE INCLUDING CAPACITIVE ELEMENT USING VERTICAL NANOWIRE FIELD EFFECT TRANSISTORS

CROSS-REFERENCE TO RELATED APPLICATIONS

This is a continuation of International Application No. PCT/JP2019/018404 filed on May 8, 2019, which claims priority to Japanese Patent Application No. 2018-097948 filed on May 22, 2018. The entire disclosures of these applications are incorporated by reference herein.

BACKGROUND

The present disclosure relates to a semiconductor integrated circuit device provided with vertical nanowire (VNW) field effect transistors (FETs), and more particularly to a layout structure of a capacitive element using VNW FETs.

In a semiconductor integrated circuit device, as the process becomes finer, the breakdown voltage of transistors tends to become lower. On the other hand, some of interfaces responsible for input/output of signals from/to the outside of the device require a high voltage exceeding the breakdown voltage of transistors according to the specifications thereof, etc.

A capacitive element is one of basic elements constituting a semiconductor integrated circuit. In a semiconductor integrated circuit device, a capacitive element is made up using transistors in some cases.

As for transistors as basic constituents of an LSI, improvement in integration degree, reduction in operating voltage, and improvement in operating speed have been achieved thanks to scaling down of the gate length. Recently, however, an increase in off current due to excessive scaling and the resulting significant increase in power consumption have raised a problem. To solve this problem, three-dimensional transistors having a three-dimensional structure, changed from the conventional planar structure, have been vigorously studied. As one type of such transistors, a vertical nanowire FET (hereinafter referred to as a VNW FET as appropriate) has attracted attention.

Japanese Unexamined Patent Publication No. H08-306870 discloses a high breakdown-voltage capacitive element made up by connecting transistors serially.

SUMMARY

There is however no prior art document that discloses a layout structure of a capacitive element using VNW FETs.

An objective of the present disclosure is providing a layout structure of a capacitive element using VNW FETs that has a high breakdown voltage.

According to a first mode of the present disclosure, in a semiconductor integrated circuit device including a capacitive element, the capacitive element includes a first transistor and a second transistor, the first transistor has a first component including one vertical nanowire (VNW) FET or a plurality of VNW FETs arranged in a first direction with gates, tops, and bottoms of the VNW FETs being independently connected with each other, the second transistor has a second component including one VNW FET or a plurality of VNW FETs arranged in the first direction with gates, tops, and bottoms of the VNW FETs being independently connected with each other, the first component and the second component are placed side by side in the first direction, the first component includes a first gate interconnect connected with the gate of the VNW FET, extending from the VNW FET away from the second component in the first direction, a first top interconnect connected with the top of the VNW FET, extending from the VNW FET toward the second component in the first direction, and a first bottom interconnect connected with the bottom of the VNW FET, extending from the VNW FET toward the second component in the first direction, the second component includes a second gate interconnect connected with the gate of the VNW FET, extending from the VNW FET toward the first component in the first direction, a second top interconnect connected with the top of the VNW FET, extending from the VNW FET away from the first component in the first direction, and a second bottom interconnect connected with the bottom of the VNW FET, extending from the VNW FET away from the first component in the first direction, and the first top interconnect, the first bottom interconnect, and the second gate interconnect are connected.

According to the above mode, the capacitive element includes a first transistor and a second transistor. The first transistor has a first component including one or a plurality of VNW FETs, and the second transistor has a second component including one or a plurality of VNW FETs. The first component and the second component are placed side by side in the first direction, and the first top interconnect and the first bottom interconnect of the first component extending toward the second component in the first direction are connected with the second gate interconnect of the second component extending toward the first component in the first direction. Having this configuration, since the source and drain of the first transistor are connected with the gate of the second transistor, a capacitive element having a high breakdown voltage is implemented by the first and second transistors.

According to a second mode of the present disclosure, in a semiconductor integrated circuit device including a capacitive element, the capacitive element includes a first transistor and a second transistor, the first transistor has a first component including one vertical nanowire (VNW) FET or a plurality of VNW FETs arranged in a first direction with gates, tops, and bottoms of the VNW FETs being independently connected with each other, the second transistor has a second component including one VNW FET or a plurality of VNW FETs arranged in the first direction with gates, tops, and bottoms of the VNW FETs being independently connected with each other, the first component and the second component are placed side by side in the first direction, the first component includes a first gate interconnect connected with the gate of the VNW FET, extending from the VNW FET away from the second component in the first direction, a first top interconnect connected with the top of the VNW FET, extending from the VNW FET toward the second component in the first direction, and a first bottom interconnect connected with the bottom of the VNW FET, extending from the VNW FET toward the second component in the first direction, the second component includes a second gate interconnect connected with the gate of the VNW FET, extending from the VNW FET away from the first component in the first direction, a second top interconnect connected with the top of the VNW FET, extending from the VNW FET toward the first component in the first direction, and a second bottom interconnect connected with the bottom of the VNW FET, extending from the VNW FET toward the first component in the first direction, and the first top interconnect and the second top interconnect are connected, and the first bottom interconnect and the second bottom interconnect are connected.

According to the above mode, the capacitive element includes a first transistor and a second transistor. The first transistor includes a first component having one or a plurality of VNW FETs, and the second transistor includes a second component having one or a plurality of VNW FETs. The first component and the second component are placed side by side in the first direction, and the first top interconnect of the first component extending toward the second component in the first direction is connected with the second top interconnect of the second component extending toward the first component in the first direction. Also, the first bottom interconnect of the first component extending toward the second component in the first direction is connected with the second bottom interconnect of the second component extending toward the first component in the first direction. Having this configuration, since the source of the first transistor and the source of the second transistor are connected and the drain of the first transistor and the drain of the second transistor are connected, a capacitive element having a high breakdown voltage is implemented by the first and second transistors.

According to a third mode of the present disclosure, in a semiconductor integrated circuit device including a capacitive element, the capacitive element includes a first transistor and a second transistor, the first transistor has a first component including one vertical nanowire (VNW) FET or a plurality of VNW FETs arranged in a first direction with gates, tops, and bottoms of the VNW FETs being independently connected with each other, the second transistor has a second component including one VNW FET or a plurality of VNW FETs arranged in the first direction with gates, tops, and bottoms of the VNW FETs being independently connected with each other, the first component and the second component are placed side by side in the first direction, the first component includes a first gate interconnect connected with the gate of the VNW FET, extending from the VNW FET toward the second component in the first direction, a first top interconnect connected with the top of the VNW FET, extending from the VNW FET away from the second component in the first direction, and a first bottom interconnect connected with the bottom of the VNW FET, extending from the VNW FET away from the second component in the first direction, the second component includes a second gate interconnect connected with the gate of the VNW FET, extending from the VNW FET toward the first component in the first direction, a second top interconnect connected with the top of the VNW FET, extending from the VNW FET away from the first component in the first direction, and a second bottom interconnect connected with the bottom of the VNW FET, extending from the VNW FET away from the first component in the first direction, and the first gate interconnect and the second gate interconnect are connected.

According to the above mode, the capacitive element includes a first transistor and a second transistor. The first transistor has a first component including one or a plurality of VNW FETs, and the second transistor has a second component including one or a plurality of VNW FETs. The first component and the second component are placed side by side in the first direction, and the first gate interconnect of the first component extending toward the second component in the first direction is connected with the second gate interconnect of the second component extending toward the first component in the first direction. Having this configuration, since the gate of the first transistor is connected with the gate of the second transistor, a capacitive element having a high breakdown voltage is implemented by the first and second transistors.

According to the present disclosure, a capacitive element having a high breakdown voltage can be implemented using VNW FETs.

BRIEF DESCRIPTION OF THE DRAWINGS

FIG. 31A is a cross-sectional view and FIG. 31B is a plan view.

DETAILED DESCRIPTION

Embodiments of the present disclosure will be described hereinafter with reference to the accompanying drawings. In the following embodiments, it is assumed that a semiconductor integrated circuit device includes a capacitive element and the capacitive element includes vertical nanowire FETs (VNW FETs).

Figure 31A:
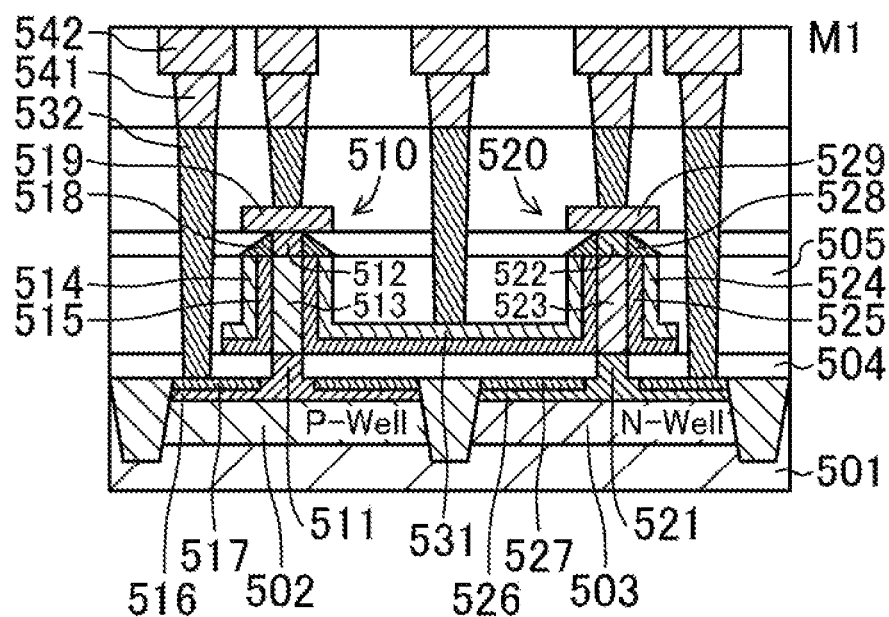
FIGS. 31A and 31B are schematic views showing a basic structure example of vertical nanowire FETs, where
Figure 31B:
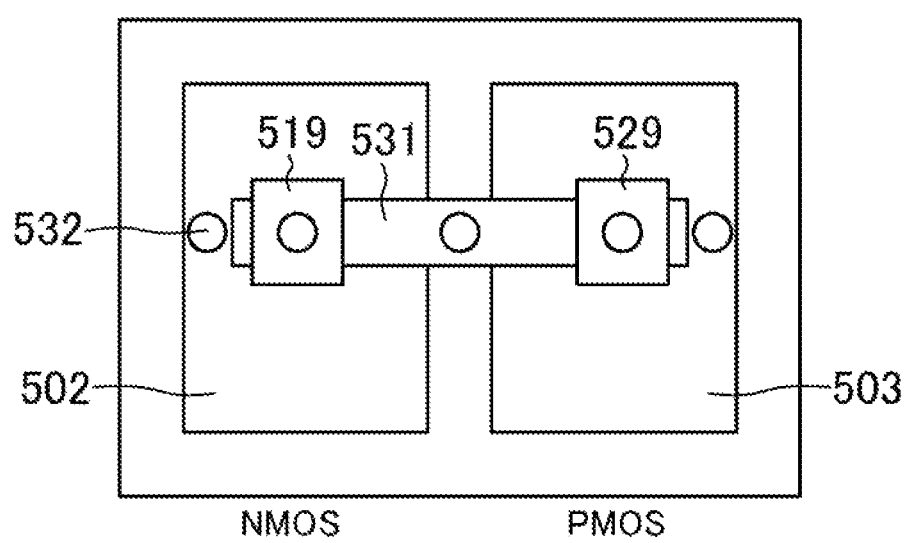

FIGS. 31A and 31B are schematic views showing a basic structure example of VNW FETs, where FIG. 31A is a cross-sectional view and FIG. 31B is a plan view. Note that, in FIG. 31B, illustration of metal interconnects is omitted and, for easy understanding, constituents invisible when actually viewed from top are illustrated.

As shown in FIGS. 31A and 31B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515. The gate electrode 514 may surround the entire of the nanowire 513, or may surround only part of the nanowire 513. When the gate electrode 514 surrounds only part of the nanowire 513, the gate insulating film 515 may be formed on only the portion of the nanowire 513 surrounded by the gate electrode 514.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note however that formation of the sidewall 518 and the silicide region 519 is not necessarily required.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note however that formation of the sidewall 528 and the silicide region 529 is not necessarily required.

In the structure of FIGS. 31A and 31B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 32A:
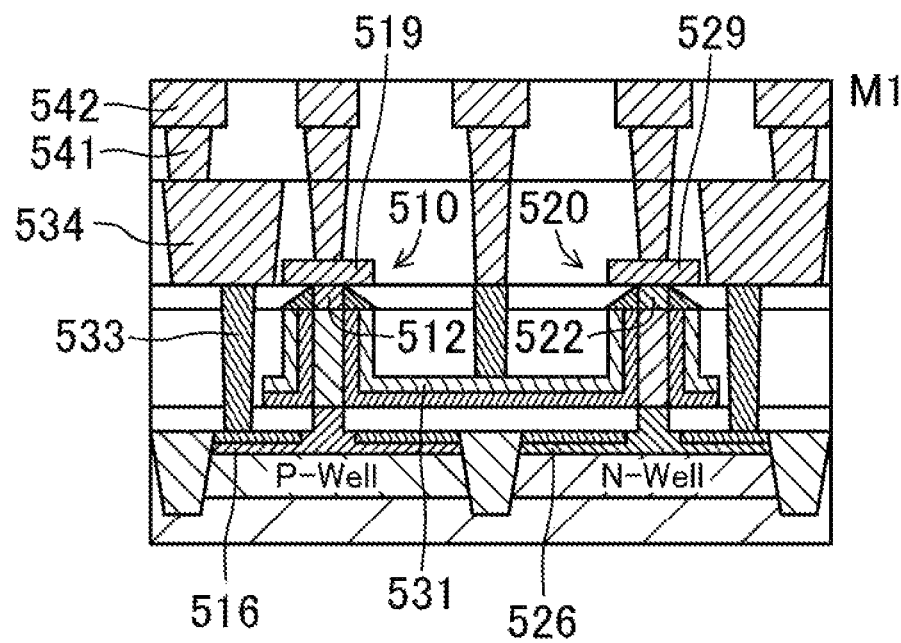
FIGS. 32A and 32B are schematic cross-sectional views showing basic structure examples of vertical nanowire FETs in which local interconnects are used.
Figure 32B:
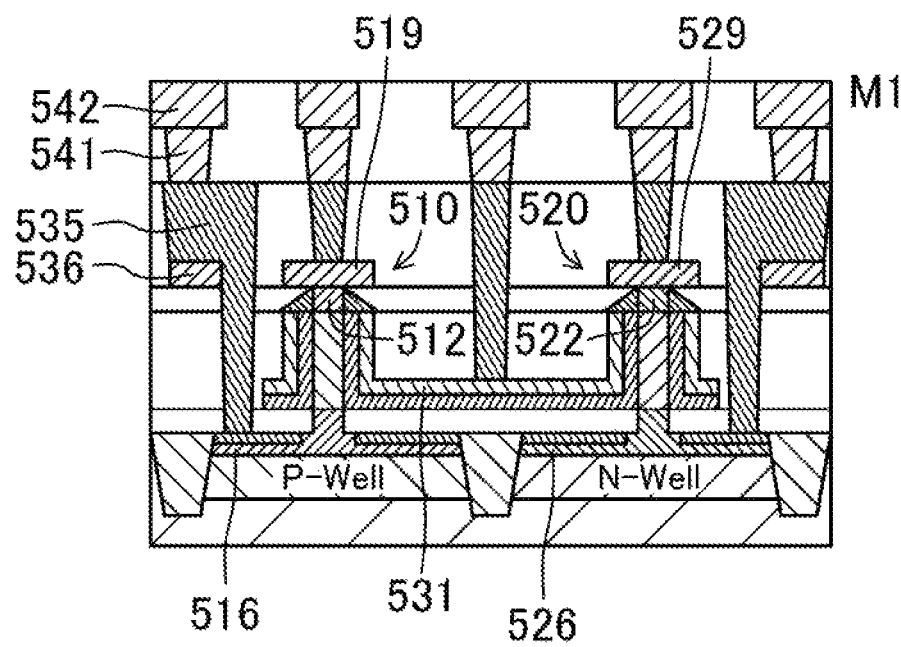

FIGS. 32A and 32B show basic structure examples of VNW FETs in which local interconnects are used. In FIG. 32A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 via the local interconnects 534 and the contacts 541.

In FIG. 32B, local interconnects 535 are formed between the metal interconnect layer M1 and the bottom regions 516 and 526. In other words, the local interconnect 535 corresponds to an integrated form of the contact 533 and the local interconnect 534 in FIG. 32A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, it is assumed that, when one or a plurality of configuration units, each constituted by a vertical nanowire, a top, a bottom, and a gate, constitute one VNW FET, this configuration unit is simply referred to as a "VNW" to distinguish this from the VNW FET.

In the following description, an expression indicating that widths, etc. are the same, like the "same interconnect width" should be understood as including a range of fabrication variations.

First Embodiment

Figure 1:
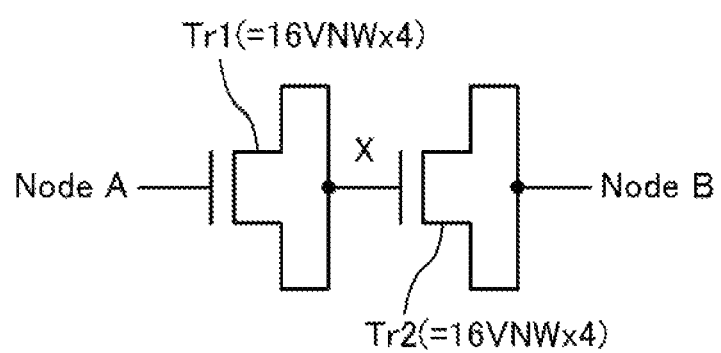
FIG. 1 is a circuit diagram showing a configuration of a capacitive element according to a first embodiment.

FIG. 1 is a circuit diagram showing a configuration of a capacitive element according to the first embodiment. A semiconductor integrated circuit device according to this embodiment includes the capacitive element shown in FIG. 1. The capacitive element of FIG. 1 includes transistors Tr1 and Tr2 placed between node A and node B. The gate of the transistor Tr1 is connected with the node A, the source and drain of the transistor Tr2 are connected with the node B, and the source and drain of the transistor Tr1 are connected with the gate of the transistor Tr2 (node X). Signals are given to the nodes A and B, or the nodes A and B are connected with power supply lines. In the latter case, the capacitive element functions as an inter-power supply capacitance.

The transistors constituting the capacitive element are assumed to be n-conductivity type transistors in this embodiment and also in the subsequent embodiments. It is however acceptable to use p-conductivity type transistors to constitute the capacitive element.

In the configuration of FIG. 1, the voltage applied to the transistors Tr1 and Tr2 becomes a half of the voltage between the nodes A and B. It is therefore possible to apply a voltage higher than the breakdown voltage of the transistors Tr1 and Tr2 to the capacitive element. Note that the number of transistors provided between the nodes A and B can be more than two.

The transistors Tr1 and Tr2 are constituted by VNW FETs. It is herein assumed that each of the transistors Tr1 and Tr2 is constituted by 16 parallel-connected VNW FETs. In the layout structure according to this embodiment, it is assumed that four capacitive elements, each having 16 VNW FETs constituting the transistor Tr1 and 16 VNW FETs constituting the transistor Tr2, are provided in parallel.

Figure 2:
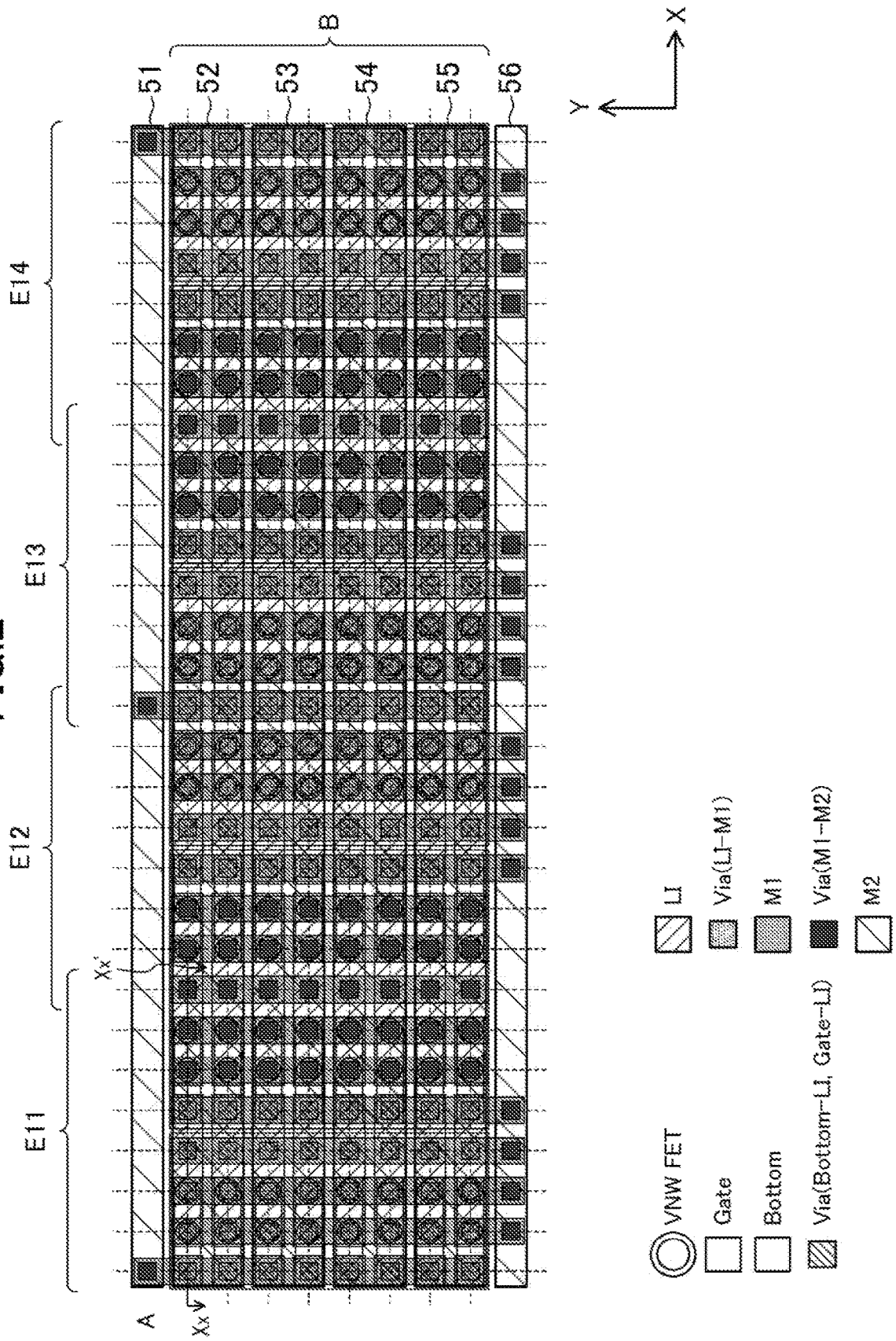
FIG. 2 is an overall plan view showing a layout structure according to the first embodiment.
Figure 3:
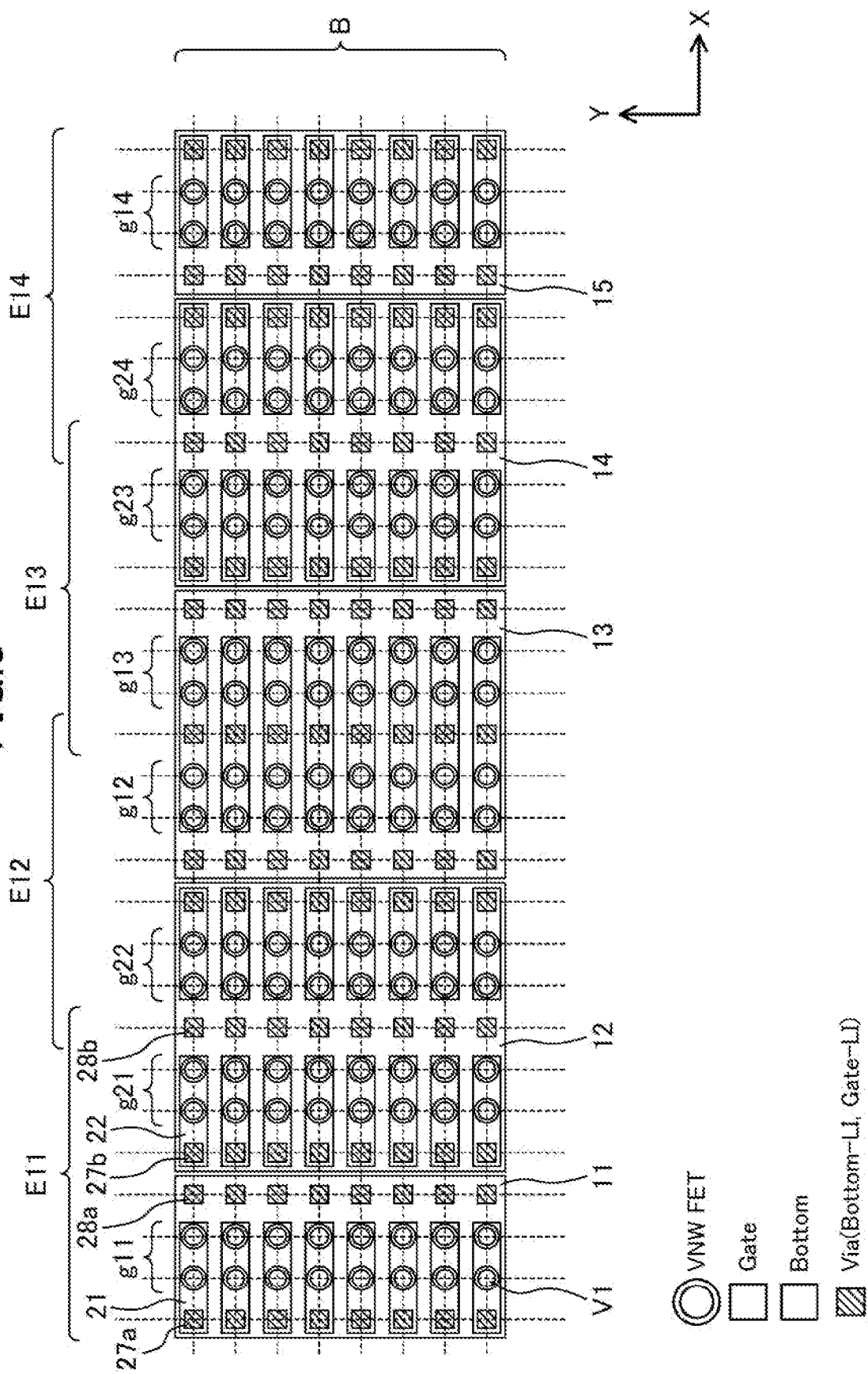
FIG. 3 is a layer-by-layer plan view showing the layout structure according to the first embodiment.
Figure 4:
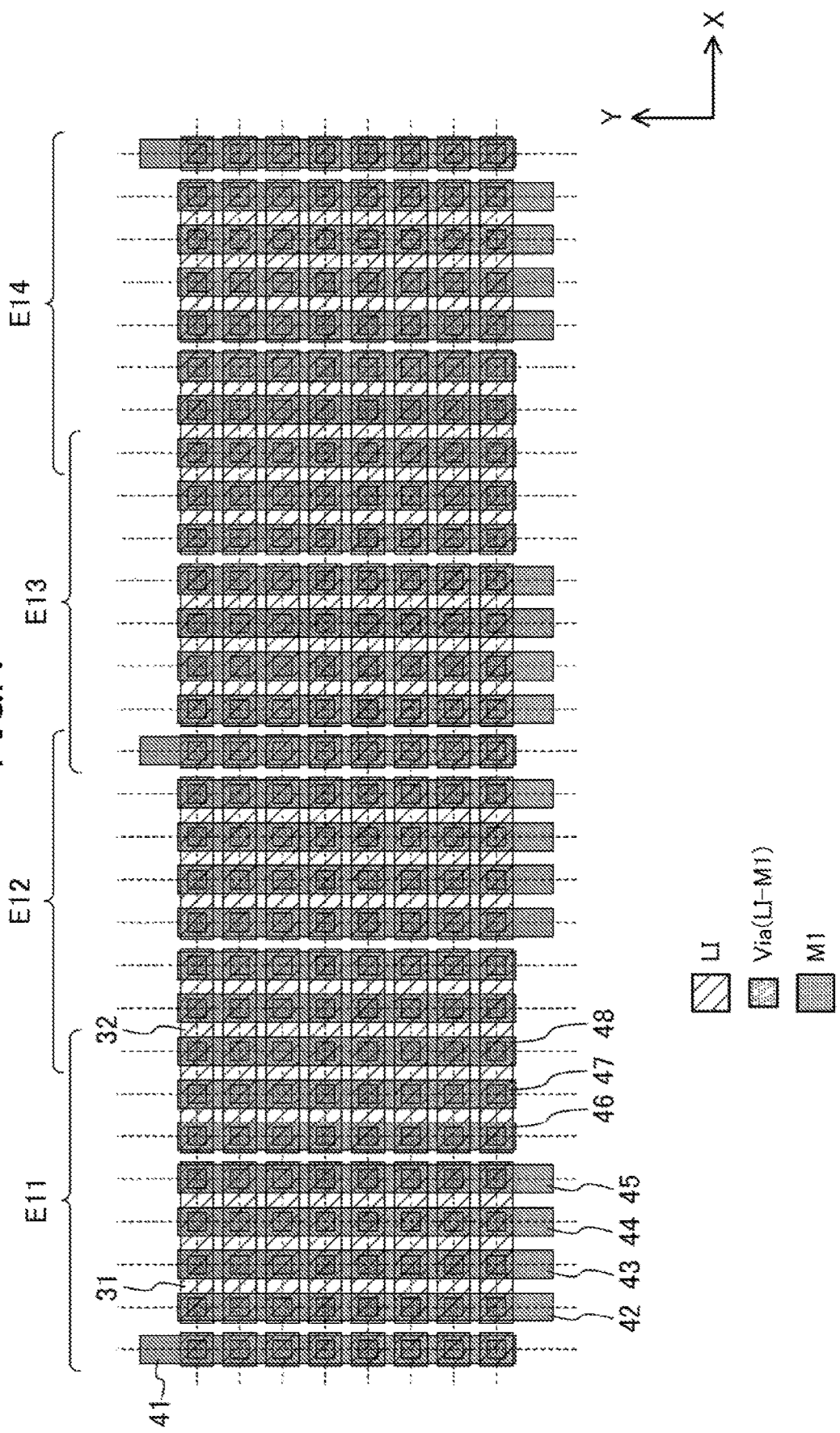
FIG. 4 is a layer-by-layer plan view showing the layout structure according to the first embodiment.
Figure 5:
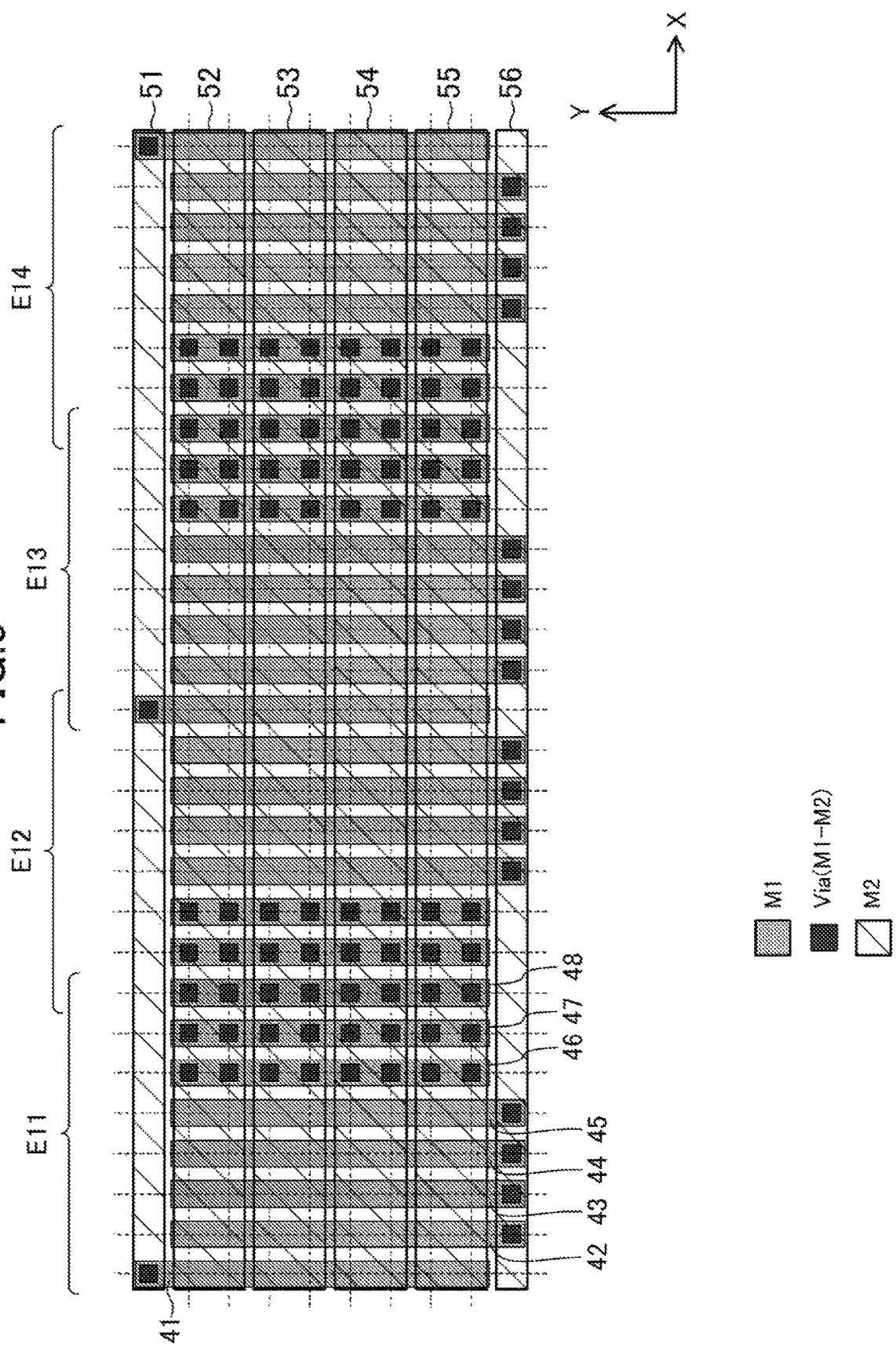
FIG. 5 is a layer-by-layer plan view showing the layout structure according to the first embodiment.
Figure 6:
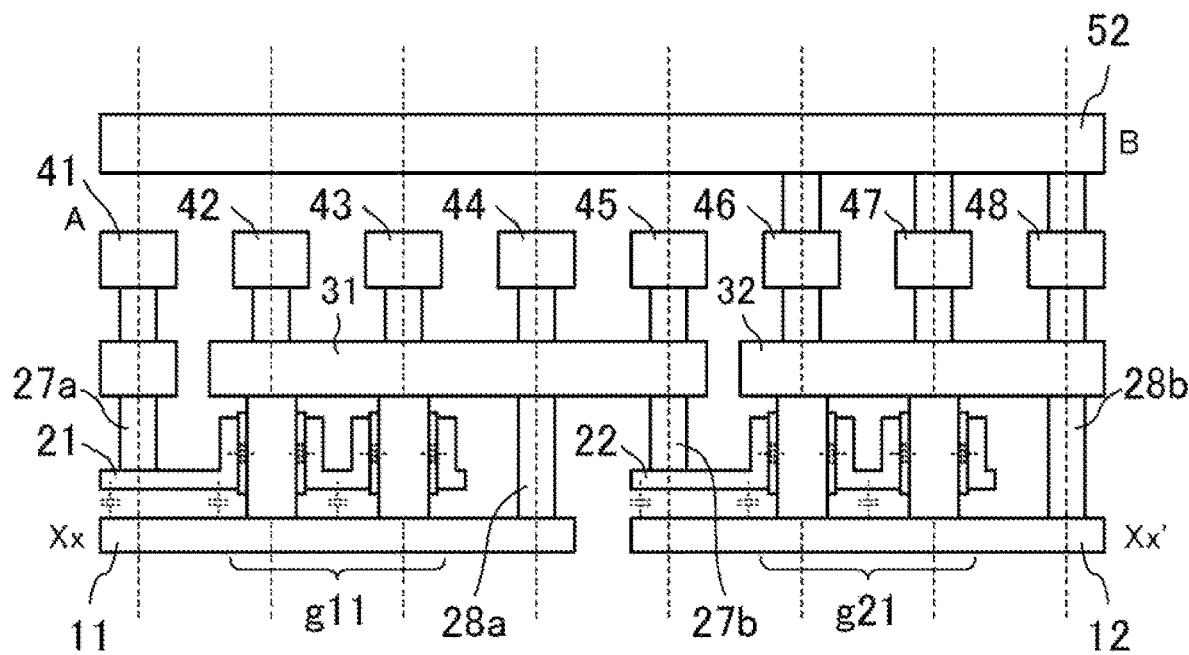
FIG. 6 is a cross-sectional view showing the layout structure according to the first embodiment.

FIGS. 2 to 6 are views showing an example of the layout structure according to this embodiment, where FIG. 2 is an overall plan view, FIGS. 3 to 5 are layer-by-layer plan views, and FIG. 6 is a cross-sectional view. Specifically, FIG. 3 shows VNW FETs and layers below them, FIG. 4 shows local interconnects and M1 interconnects above the VNW FETs, and FIG. 5 shows the M1 interconnects and M2 interconnects. FIG. 6 is a cross-sectional view taken horizontally as viewed from top in FIG. 2, showing a cross section along line Xx-Xx'.

In the plan views such as FIG. 2, the horizontal direction as viewed from the figure is referred to as the X direction (corresponding to the first direction) and the vertical direction as the Y direction (corresponding to the second direction). This also applies to the subsequent plan views. The dashed lines running vertically and horizontally in the plan views such as FIG. 2 and the dashed lines running vertically in the cross-sectional views such as FIG. 6 represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be placed at different spacing. Further, the components are not necessarily required to lie on grid lines. It is however preferable to place the components on grid lines from the standpoint of preventing or reducing fabrication variations.

The device structure according to this embodiment is based on the structure of FIG. 32A, although it can be a structure based on the structure of FIG. 31A or FIG. 32B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

As shown in FIG. 2, etc., M2 interconnects 51, 52, 53, 54, 55, and 56 extending in the X direction are placed: the M2 interconnect 51 corresponds to the node A and the M2 interconnects 52, 53, 54, and 55 correspond to the node B. Capacitive elements E11, E12, E13, and E14 are formed below the M2 interconnects 51 to 56. The capacitive elements E11, E12, E13, and E14 are arranged in the X direction and, in terms of circuitry, provided between the M2 interconnect 51 and the M2 interconnects 52 to 55. The capacitive elements E11 to E14 have basically the same layout shape, although the layout shape of the capacitive elements E12 and E14 is one flipped from that of the capacitive element E11 in the X direction. Also, any adjacent capacitive elements, e.g., the capacitive elements E1 and E2 share a portion of the layout corresponding to one grid spacing.

As shown in FIG. 3, a total of 128 VNW FETs V1 are arranged in an array of 16 columns in the X direction and eight rows in the Y direction, with a spacing provided every two columns in the X direction. Groups of two columns of VNW FETs V1 each are herein denoted by g11, g21, g22, g12, g13, g23, g24, and g14 in this order from the left as viewed from the figure. Each of the groups g11 to g14 and g21 to g24 includes a total of 16 VNW FETs V1 in two columns in the X direction and eight rows in the Y direction.

The groups g11 and g21 respectively constitute the transistors Tr1 and Tr2 of the capacitive element E11. The groups g12 and g22 respectively constitute the transistors Tr1 and Tr2 of the capacitive element E12. The groups g13 and g23 respectively constitute the transistors Tr1 and Tr2 of the capacitive element E13. The groups g14 and g24 respectively constitute the transistors Tr1 and Tr2 of the capacitive element E14. The groups g11, g12, g13, and g14 correspond to the first component, and the groups g21, g22, g23, and g24 correspond to the second component.

Bottom regions 11, 12, 13, 14, and 15 are formed. The VNW FETs V1 of the group g11 are formed on the bottom region 11, and the bottoms thereof are connected with the bottom region 11. The VNW FETs V1 of the groups g21 and g22 are formed on the bottom region 12, and the bottoms thereof are connected with the bottom region 12. The VNW FETs V1 of the groups g12 and g13 are formed on the bottom region 13, and the bottoms thereof are connected with the bottom region 13. The VNW FETs V1 of the groups g23 and g24 are formed on the bottom region 14, and the bottoms thereof are connected with the bottom region 14. The VNW FETs V1 of the group g14 are formed on the bottom region 15, and the bottoms thereof are connected with the bottom region 15.

Taking the capacitive element E11 as an example, the layout structure thereof will be described hereinafter in detail.

In the group g11, the gates of two VNW FETs V1 adjacent in the X direction are mutually connected. In the group g21, the gates of two VNW FETs V1 adjacent in the X direction are mutually connected. Gate interconnects 21 are drawn leftward from the group g11 as viewed from the figure, and gate interconnects 22 are drawn leftward from the group g21 as viewed from the figure. Vias 27a and 27b are formed on the drawn portions of the gate interconnects 21 and 22 for connection with local interconnects formed above. Also, vias 28a and 28b are formed on the bottom regions 11 and 12 for connection with local interconnects formed above. The vias 28a are placed on the right side of the group g11 as viewed from the figure, and the vias 29a are placed on the right side of the group g21 as viewed from the figure.

Local interconnects 31 extending in the X direction are formed above the group g11. In the group g11, the tops of two VNW FETs V1 adjacent in the X direction are mutually connected through the corresponding local interconnect 31. The local interconnects 31 extend up to the positions of the vias 28a and 27b, to be connected with the vias 28a and 27b. That is, each of the local interconnects 31 is connected with the tops and bottoms of two VNW FETs V1 of the group g11 adjacent in the X direction and also connected with the gates of two VNW FETs V1 of the group g21 adjacent in the X direction.

Local interconnects 32 extending in the X direction are formed above the group g21. In the group g21, the tops of two VNW FETs V1 adjacent in the X direction are mutually connected through the corresponding local interconnect 32. The local interconnects 32 extend up to the positions of the vias 28b, to be connected with the vias 28b. Note that the local interconnects 32 further extend to a region above the group g22.

In an M1 interconnect layer, M1 interconnects 41, 42, 43, 44, 45, 46, 47, and 48 extending in the Y direction are formed above the capacitive element E11. The M1 interconnect 41 is connected with the vias 27a formed on the gate interconnects 21 through local interconnects. The M1 interconnect 41 is also connected with the M2 interconnect 51 that is to be the node A through a via. That is, the gates of the VNW FETs V1 of the group g11 are connected with the M2 interconnect 51, i.e., the node A through the gate interconnects 21, the vias 27a, and the M1 interconnect 41.

The M1 interconnects 42 to 45 are connected with the local interconnects 31 through vias. The M1 interconnects 42 to 45 are also connected with the M2 interconnect 56 through vias. That is, the tops and bottoms of the VNW FETs V1 of the group g11 are mutually connected through the vias 28a, the local interconnects 31, the M1 interconnects 42 to 45, and the M2 interconnect 56. Also, the tops and bottoms of the VNW FETs V1 of the group g11 are connected with the gates of the VNW FETs V1 of the group g21 through the local interconnects 31, the vias 27b, and the gate interconnects 22. The local interconnects 31 and the M1 interconnects 42 to 45 correspond to the node X.

The M1 interconnects 46 to 48 are connected with the local interconnects 32 through vias. The M1 interconnects 46 to 48 are also connected with the M2 interconnects 52 to 55 through vias. That is, the tops and bottoms of the VNW FETs V1 of the group g21 are connected with the M2 interconnects 52 to 55, i.e., the node B through the vias 28b, the local interconnects 32, and the M1 interconnects 46 to 48.

In the cross-sectional view of FIG. 6, examples of locations where a capacitance is generated are shown by dotted lines. That is, a capacitance is generated at a gate oxide film of a VNW FET, and a capacitance is generated between a gate interconnect and a bottom region. Although not illustrated, a capacitance is also generated at other locations such as between a gate interconnect and a top interconnect. With these capacitances, the capacitive element according to this embodiment acquires a large capacitance value.

With the layout structure described above, the capacitive element E11, for example, includes the transistors Tr1 and Tr2: the transistor Tr1 has the group g11 including 16 VNW FETs and the transistor Tr2 has the group g21 including 16 VNW FETs. The groups g11 and g21 are placed side by side in the X direction. The top interconnects (the local interconnects 31 in the illustrated example) and the bottom interconnects (the bottom region 11 in the illustrated example) for the group g11, extending toward the group g21 in the X direction, are connected with the gate interconnects 22 for the group g21 extending toward the group g11 in the X direction. Thus, with the top and bottom of the transistor Tr1 being connected with the gate of the transistor Tr2, a capacitive element having a high breakdown voltage can be implemented by the transistors Tr1 and Tr2.

Also, in this embodiment, as is found from the cross-sectional view of FIG. 6, the portion of the capacitive element electrically connected with the node A is sufficiently spaced from the portion thereof electrically connected with the node B. That is, a distance corresponding to one grid spacing is secured between the node B-side end of the gate interconnect 21 connected with the node A and the node A-side end of the bottom region 12 connected with the node B. This improves the reliability as the capacitive element.

In the configuration described above, the gate interconnects 21 and 22 are formed to extend in the X direction and have the same interconnect width. The local interconnects 31 and 32 are formed to extend in the X direction and have the same interconnect width. The M1 interconnects 41 to 48 are formed to extend in the Y direction and have the same interconnect width. In this way, with the interconnects being the same in direction and width in each interconnect layer, the fabrication becomes easy and the fabrication precision improves. Note that, while the gate interconnects 21 and 22, the local interconnects 31 and 32, and the M1 interconnects 41 to 48 appear to be the same in interconnect width in the illustrated configuration, the interconnect width does not need to be the same in different interconnect layers. If only the interconnects are the same in direction and width in one interconnect layer, the fabrication will become easy and the fabrication precision will improve.

While each of the bottom regions 11 to 15 is formed to be continuous in the Y direction in the configuration described above, the bottom region may be formed separately for each of rows of VNW FETs V1 lining up in the X direction. That is, bottom interconnects extending in the X direction may be arranged in the Y direction. Note however that, with the integrally-formed bottom region, a voltage is equally applied to the VNW FETs V1.

While the local interconnects 31 and 32 are formed individually for each of rows of VNW FETs lining up in the X direction in the configuration described above, the local interconnects may be formed to be continuous in the Y direction. Also, M1 interconnects to be connected to a same continuous local interconnect may be formed integrally.

The M2 interconnect 56 may be omitted. In this case, since the nodes X of the capacitive elements E11 to E14 are not mutually connected, they are to be provided individually between the nodes A and B. It is however preferable to provide the M2 interconnect 56 to mutually connect the nodes X of the capacitive elements E11 to E14 because by this connection a voltage is equally applied to the capacitive elements E11 to E14.

As shown in the cross-sectional view of FIG. 6, the bottom region 11 ranges from the region connected with the bottoms of the VNW FETs V1 of the group g11 to the portion overlapping the M1 interconnect 41 as viewed from top. However, it is only necessary to form the bottom region 11 in a range where the connection with the VNW FETs V1 of the group g11 and the vias 28a is secured. Similarly, the bottom region 12 ranges from the region connected with the bottoms of the VNW FETs V1 of the group g21 to the portion overlapping the M1 interconnect 45 as viewed from top. However, it is only necessary to form the bottom region 12 in a range where the connection with the VNW FETs V1 of the group g21 and the vias 28b is secured.

Second Embodiment

Figure 7:
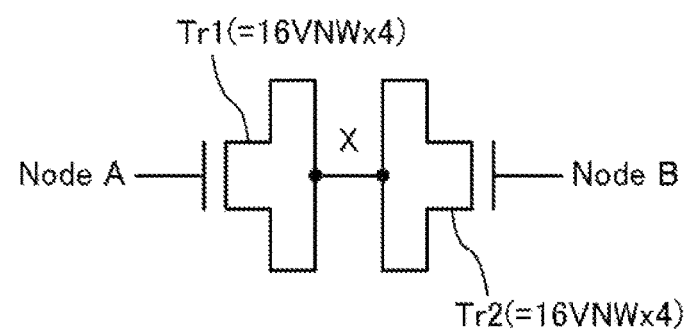
FIG. 7 is a circuit diagram showing a configuration of a capacitive element according to a second embodiment.

FIG. 7 is a circuit diagram showing a configuration of a capacitive element according to the second embodiment. A semiconductor integrated circuit device according to this embodiment includes the capacitive element shown in FIG. 7. The capacitive element of FIG. 7 includes transistors Tr1 and Tr2 placed between node A and node B. The gate of the transistor Tr1 is connected with the node A, and the gate of the transistor Tr2 is connected with the node B. The source and drain of the transistor Tr1 are mutually connected, the source and drain of the transistor Tr2 are mutually connected, and the source and drain of the transistor Tr1 are connected with the source and drain of the transistor Tr2 (node X). Signals are given to the nodes A and B, or the nodes A and B are connected with power supply lines. In the latter case, the capacitive element functions as an inter-power supply capacitance.

In the configuration of FIG. 7, the voltage applied to the transistors Tr1 and Tr2 becomes a half of the voltage between the nodes A and B. It is therefore possible to apply a voltage higher than the breakdown voltage of the transistors Tr1 and Tr2 to the capacitive element. Note that the number of transistors provided between the nodes A and B can be more than two.

The transistors Tr1 and Tr2 are constituted by VNW FETs. It is herein assumed that each of the transistors Tr1 and Tr2 is constituted by 16 parallel-connected VNW FETs. In the layout structure according to this embodiment, it is assumed that four capacitive elements, each having 16 VNW FETs constituting the transistor Tr1 and 16 VNW FETs constituting the transistor Tr2, are provided in parallel.

Figure 8:
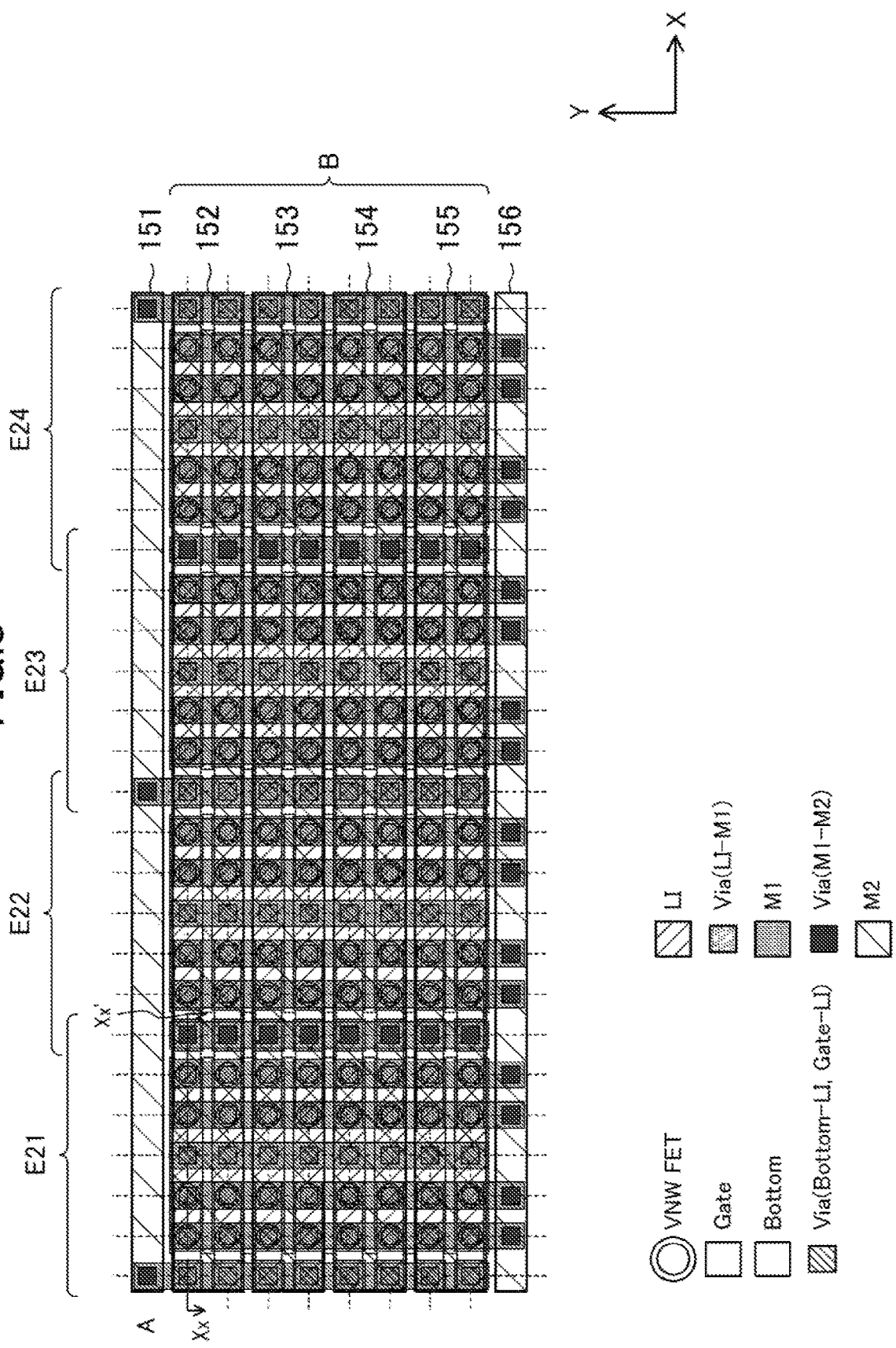
FIG. 8 is an overall plan view showing a layout structure according to the second embodiment.
Figure 9:
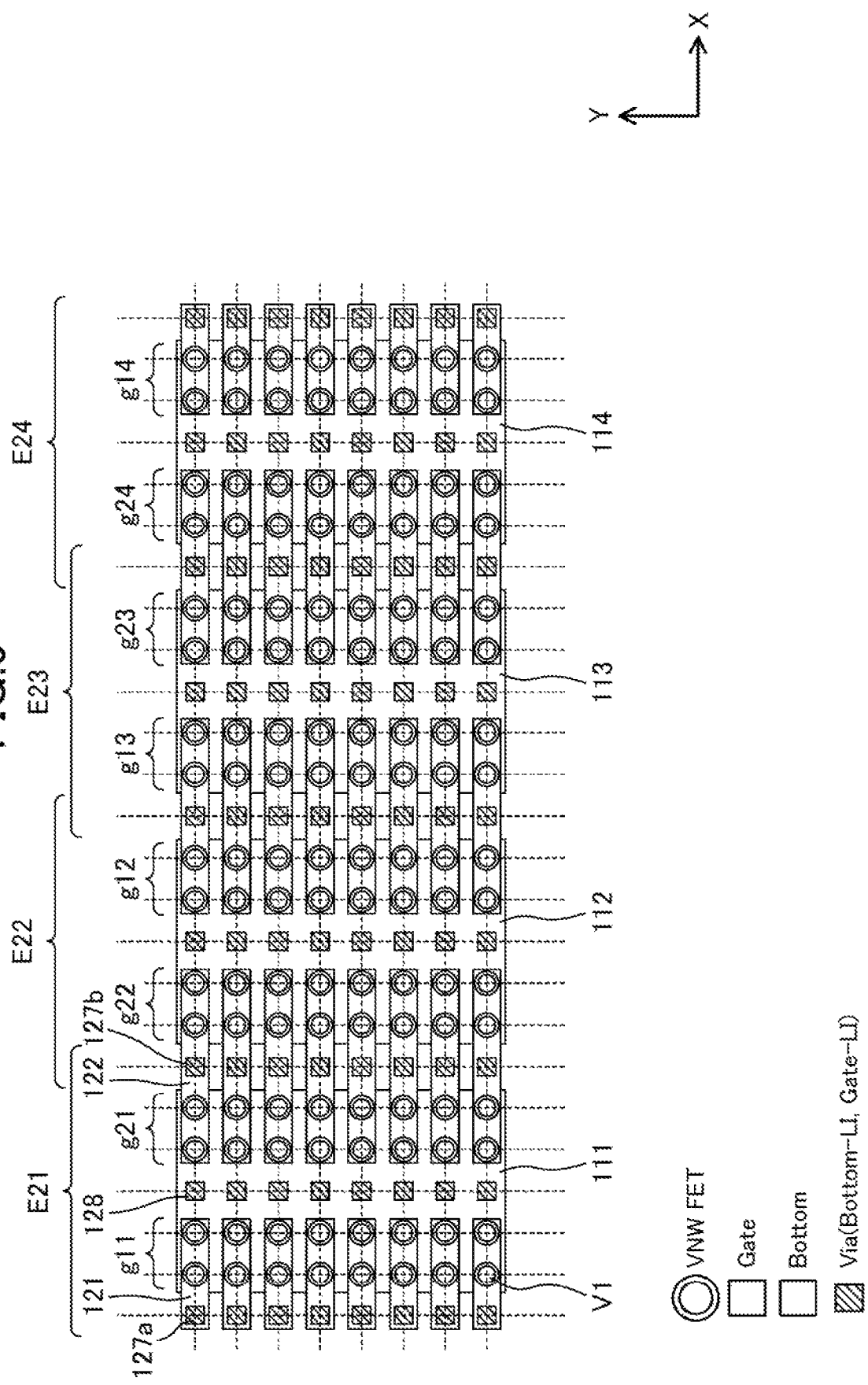
FIG. 9 is a layer-by-layer plan view showing the layout structure according to the second embodiment.
Figure 10:
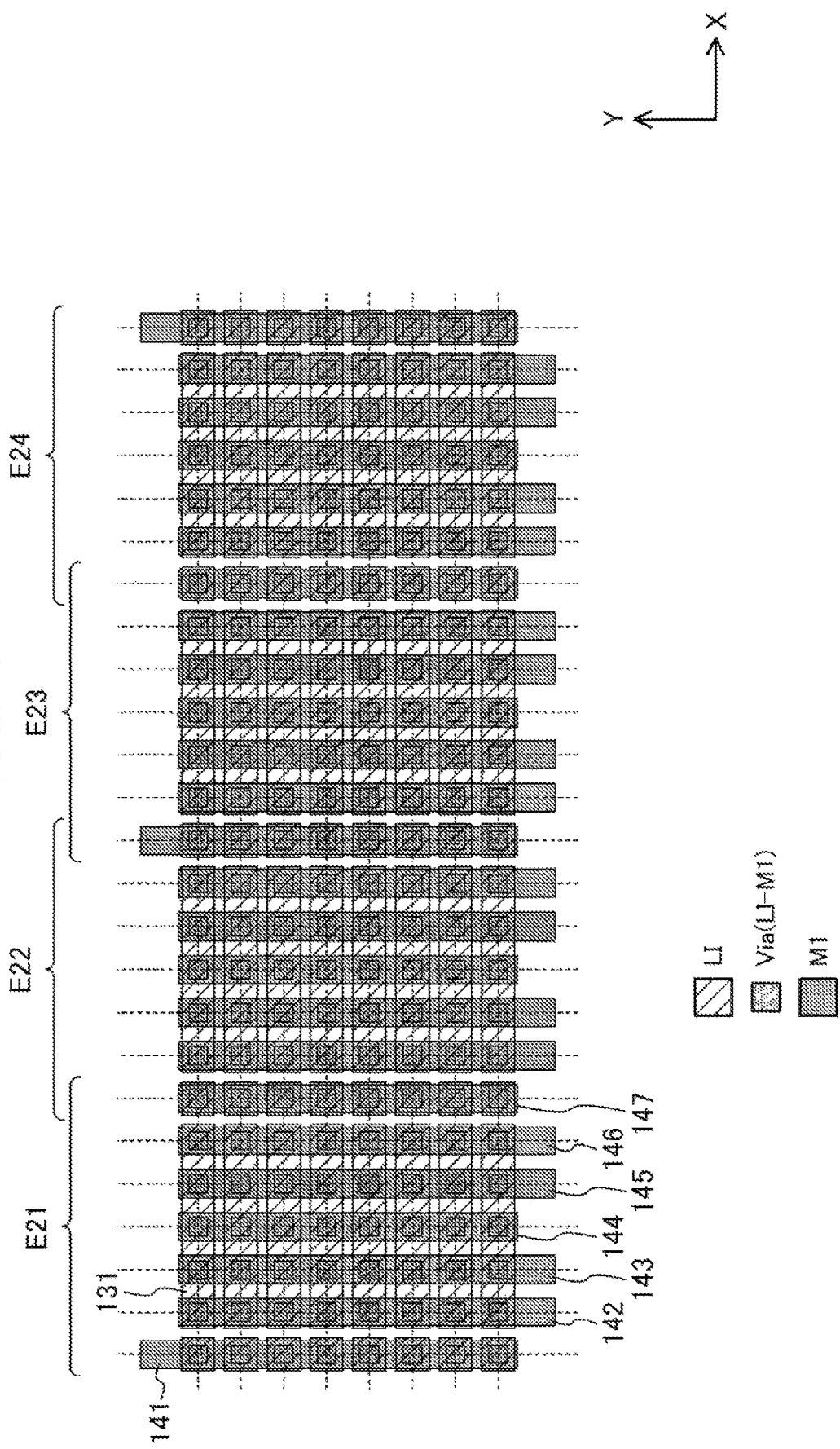
FIG. 10 is a layer-by-layer plan view showing the layout structure according to the second embodiment.
Figure 11:
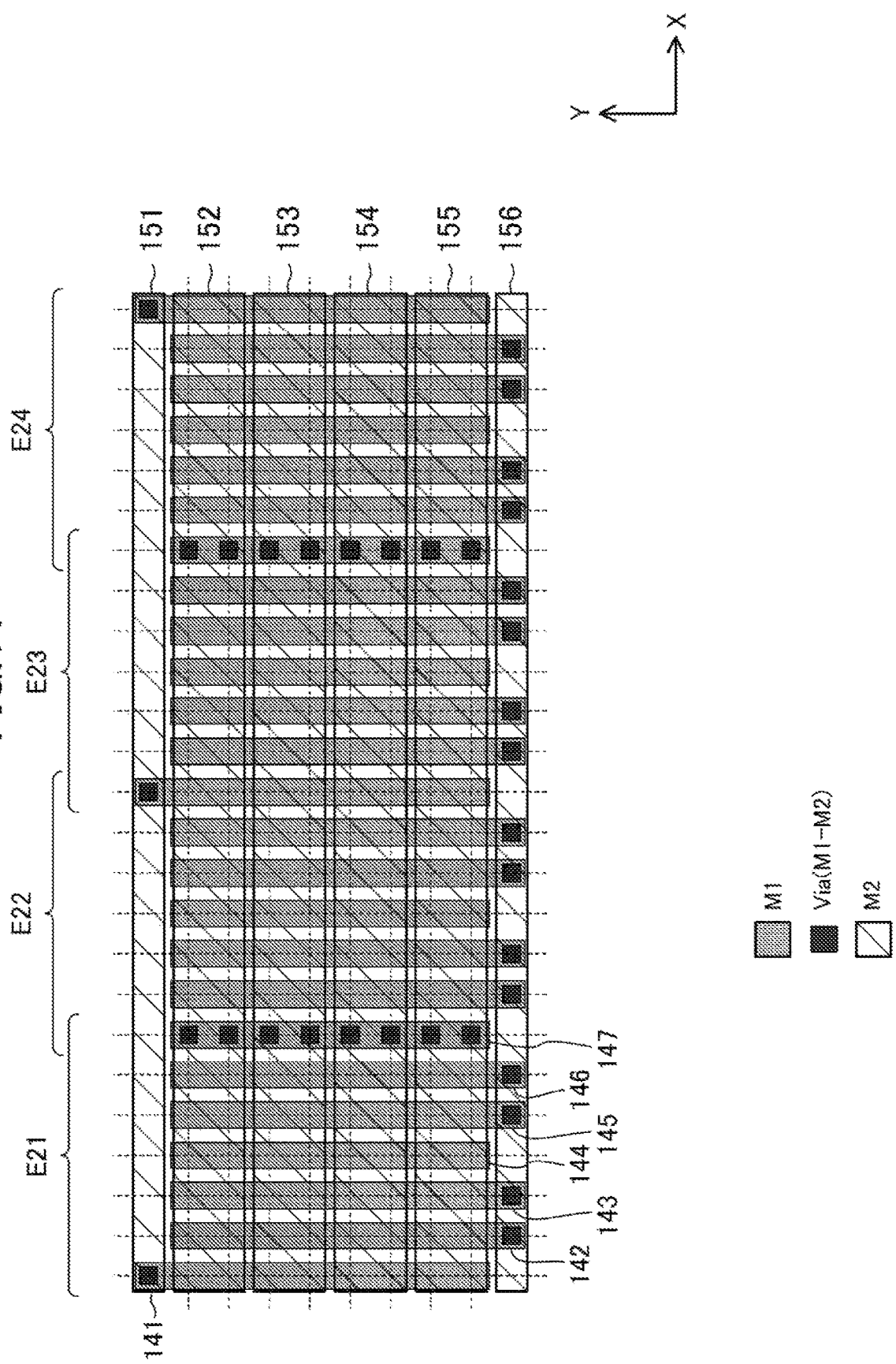
FIG. 11 is a layer-by-layer plan view showing the layout structure according to the second embodiment.
Figure 12:
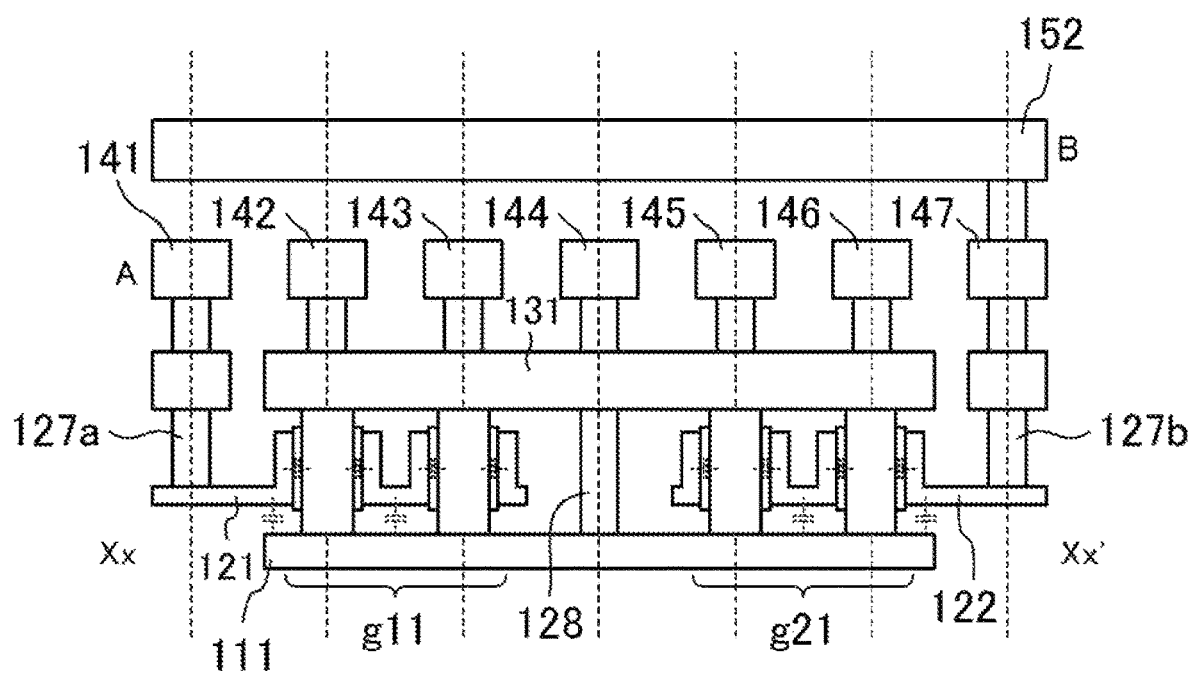
FIG. 12 is a cross-sectional view showing the layout structure according to the second embodiment.

FIGS. 8 to 12 are views showing a structure example of the capacitive element according to this embodiment, where FIG. 8 is an overall plan view, FIGS. 9 to 11 are layer-by-layer plan views, and FIG. 12 is a cross-sectional view. Specifically, FIG. 9 shows VNW FETs and layers below them, FIG. 10 shows local interconnects and M1 interconnects above the VNW FETs, and FIG. 11 shows the M1 interconnects and M2 interconnects. FIG. 12 is a cross-sectional view taken horizontally as viewed from top in FIG. 8, showing a cross section along line Xx-Xx'.

As shown in FIG. 8, etc., M2 interconnects 151, 152, 153, 154, 155, and 156 extending in the X direction are placed: the M2 interconnect 151 corresponds to the node A and the M2 interconnects 152, 153, 154, and 155 correspond to the node B. Capacitive elements E21, E22, E23, and E24 are formed below the M2 interconnects 151 to 156. The capacitive elements E21, E22, E23, and E24 are arranged in the X direction and, in terms of circuitry, provided between the M2 interconnect 151 and the M2 interconnects 152 to 155. The capacitive elements E21 to E24 have basically the same layout shape, although the layout shape of the capacitive elements E22 and E24 is one flipped from that of the capacitive element E21 in the X direction. Also, any adjacent capacitive elements, e.g., the capacitive elements E21 and E22 share a portion of the layout corresponding to one grid spacing.

As shown in FIG. 9, a total of 128 VNW FETs V1 are arranged in an array of 16 columns in the X direction and eight rows in the Y direction, with a spacing provided every two columns in the X direction. Groups of two columns of VNW FETs V1 each are herein denoted by g11, g21, g22, g12, g13, g23, g24, and g14 in this order from the left as viewed from the figure. Each of the groups g11 to g14 and g21 to g24 includes a total of 16 VNW FETs V1 in two columns in the X direction and eight rows in the Y direction.

The groups g11 and g21 respectively constitute the transistors Tr1 and Tr2 of the capacitive element E21. The groups g12 and g22 respectively constitute the transistors Tr1 and Tr2 of the capacitive element E22. The groups g13 and g23 respectively constitute the transistors Tr1 and Tr2 of the capacitive element E23. The groups g14 and g24 respectively constitute the transistors Tr1 and Tr2 of the capacitive element E24. The groups g11, g12, g13, and g14 correspond to the first component, and the groups g21, g22, g23, and g24 correspond to the second component.

Bottom regions 111, 112, 113, and 114 are formed. The VNW FETs V1 of the groups g11 and g21 are formed on the bottom region 111, and the bottoms thereof are connected with the bottom region 111. The VNW FETs V1 of the groups g22 and g12 are formed on the bottom region 112, and the bottoms thereof are connected with the bottom region 112. The VNW FETs V1 of the groups g13 and g23 are formed on the bottom region 113, and the bottoms thereof are connected with the bottom region 113. The VNW FETs V1 of the groups g24 and g14 are formed on the bottom region 114, and the bottoms thereof are connected with the bottom region 114.

Taking the capacitive element E21 as an example, the layout structure thereof will be described hereinafter in detail.

In the groups g11 and g21, the gates of two VNW FETs V1 adjacent in the X direction are mutually connected. Gate interconnects 121 are drawn leftward from the group g11 as viewed from the figure, and gate interconnects 122 are drawn rightward from the group g21 as viewed from the figure. Note that each of the gate interconnects 122 is formed integrally with a gate interconnect drawn leftward from the group g22 as viewed from the figure. Vias 127a and 127b are formed on the drawn portions of the gate interconnects 121 and 122 for connection with local interconnects formed above. Also, vias 128 are formed on the bottom region 111 for connection with local interconnects formed above. The vias 128 are placed between the groups g11 and g21.

Local interconnects 131 extending in the X direction are formed above the groups g11 and g21. The tops of four VNW FETs V1 lining up in the X direction in the groups g11 and g21 are mutually connected through the corresponding local interconnect 131. The local interconnects 131 are also connected with the vias 128. That is, each of the local interconnects 131 is connected with the tops and bottoms of four VNW FETs V1 lining up in the X direction in the groups g11 and g21.

In an M1 interconnect layer, M1 interconnects 141, 142, 143, 144, 145, 146, and 147 extending in the Y direction are formed above the capacitive element E21. The M1 interconnect 141 is connected with the vias 127a formed on the gate interconnects 121 through local interconnects. The M1 interconnect 141 is also connected with the M2 interconnect 151 that is to be the node A through a via. That is, the gates of the VNW FETs V1 of the group g11 are connected with the M2 interconnect 151, i.e., the node A through the gate interconnects 121, the vias 127a, and the M1 interconnect 141.

The M1 interconnects 142 to 146 are connected with the local interconnects 131 through vias. The M1 interconnects 142, 143, 145, and 146 are also connected with the M2 interconnect 156 through vias. That is, the tops and bottoms of the VNW FETs V1 of the group g11 and the tops and bottoms of the VNW FETs V1 of the group g21 are mutually connected through the vias 128, the local interconnects 131, the M1 interconnects 142 to 146, and the M2 interconnect 156. The local interconnects 131 and the M1 interconnects 142 to 146 correspond to the node X.

The M1 interconnect 147 is connected with the vias 127b formed on the gate interconnects 122, through local interconnects. The M1 interconnect 147 is also connected with the M2 interconnects 152 to 155 that are to be the node B through vias. That is, the gates of the VNW FETs V1 of the group g21 are connected with the M2 interconnects 152 to 155, i.e., the node B through the gate interconnects 122, the vias 127b, and the M1 interconnect 147.

In the cross-sectional view of FIG. 12, examples of locations where a capacitance is generated are shown by dotted lines. That is, a capacitance is generated at a gate oxide film of a VNW FET, and a capacitance is generated between a gate interconnect and a bottom region. Although not illustrated, a capacitance is also generated at other locations such as between a gate interconnect and a top interconnect. With these capacitances, the capacitive element according to this embodiment acquires a large capacitance value.

With the layout structure described above, the capacitive element E21, for example, includes the transistors Tr1 and Tr2: the transistor Tr1 has the group g11 including 16 VNW FETs and the transistor Tr2 has the group g21 including 16 VNW FETs. The groups g11 and g21 are placed side by side in the X direction. The bottom interconnects for the group g11 extending toward the group g21 in the X direction are connected with the bottom interconnects for the group g21 extending toward the group g11 in the X direction (in the illustrated example, these bottom interconnects are formed as the single bottom region 111). Also, the top interconnects for the group g11 extending toward the group g21 in the X direction are connected with the top interconnects for the group g21 extending toward the group g11 in the X direction (in the illustrated example, these top interconnects are formed as the single local interconnects 131). Thus, with the top of the transistor Tr1 being connected with the top of the transistor Tr2 and the bottom of the transistor Tr1 being connected with the bottom of the transistor Tr2, a capacitive element having a high breakdown voltage can be implemented by the transistors Tr1 and Tr2. Further, since the bottom region 111 and the local interconnects 131 are connected through the vias 128, the tops of the transistors Tr1 and Tr2 are connected with the bottoms of the transistors Tr1 and Tr2.

In this embodiment, also, the bottoms of the VNW FETs V1 of the group g11 and the bottoms of the VNW FETs V1 of the group g21 are connected to the same bottom region 111. That is, the bottoms of the VNW FETs V1 of the groups g11 and g21 are connected without intervention of contacts or interconnects. This makes it possible to implement a capacitive element with a smaller layout area.

In this embodiment, as is found from the cross-sectional view of FIG. 12, the portion of the capacitive element electrically connected with the node A is sufficiently spaced from the portion thereof electrically connected with the node B. That is, a distance corresponding to one grid spacing is secured between node B-side end of the gate interconnect 121 connected with the node A and node A-side end of the gate interconnect 122 connected with the node B. This improves the reliability as the capacitive element.

In the configuration described above, the gate interconnects 121 and 122 are formed to extend in the X direction and have the same interconnect width. The local interconnects 131 are formed to extend in the X direction and have the same interconnect width. The M1 interconnects 141 to 147 are formed to extend in the Y direction and have the same interconnect width. In this way, with the interconnects being the same in direction and width in each interconnect layer, the fabrication becomes easy and the fabrication precision improves. Note that, while the gate interconnects 121 and 122, the local interconnects 131, and the M1 interconnects 141 to 147 appear to be the same in interconnect width in the illustrated configuration, the interconnect width does not need to be the same in different interconnect layers. If only the interconnects are the same in direction and width in one interconnect layer, the fabrication will become easy and the fabrication precision will improve.

While each of the bottom regions 111 to 114 is formed to be continuous in the Y direction in the configuration described above, the bottom region may be formed separately for each of rows of VNW FETs V1 lining up in the X direction. That is, bottom interconnects extending in the X direction may be arranged in the Y direction. Note however that, with the integrally-formed bottom region, a voltage is equally applied to the VNW FETs V1.

While the local interconnects 131 are formed individually for each of rows of VNW FETs V1 lining up in the X direction in the configuration described above, the local interconnects may be formed to be continuous in the Y direction. Also, M1 interconnects to be connected to a same local interconnect may be formed integrally.

The M2 interconnect 156 may be omitted. In this case, since the nodes X of the capacitive elements E21 to E24 are not mutually connected, they are to be provided individually between the nodes A and B. It is however preferable to provide the M2 interconnect 156 to mutually connect the nodes X of the capacitive elements E21 to E24 because by this connection a voltage is equally applied to the capacitive elements E21 to E24.

<Alteration>

Figure 13:
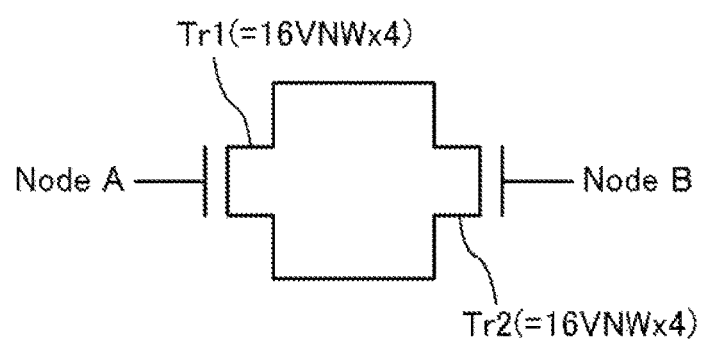
FIG. 13 is a circuit diagram showing a configuration of a capacitive element according to an alteration of the second embodiment.

FIG. 13 is a circuit diagram showing a configuration of a capacitive element according to an alteration of the second embodiment. In the capacitive element of FIG. 13, the sources of the transistors Tr1 and Tr2 are mutually connected, and the drains thereof are mutually connected. No connection is however made between the sources and drains of the transistors Tr1 and Tr2, which is different from the capacitive element of FIG. 7.

Figure 14:
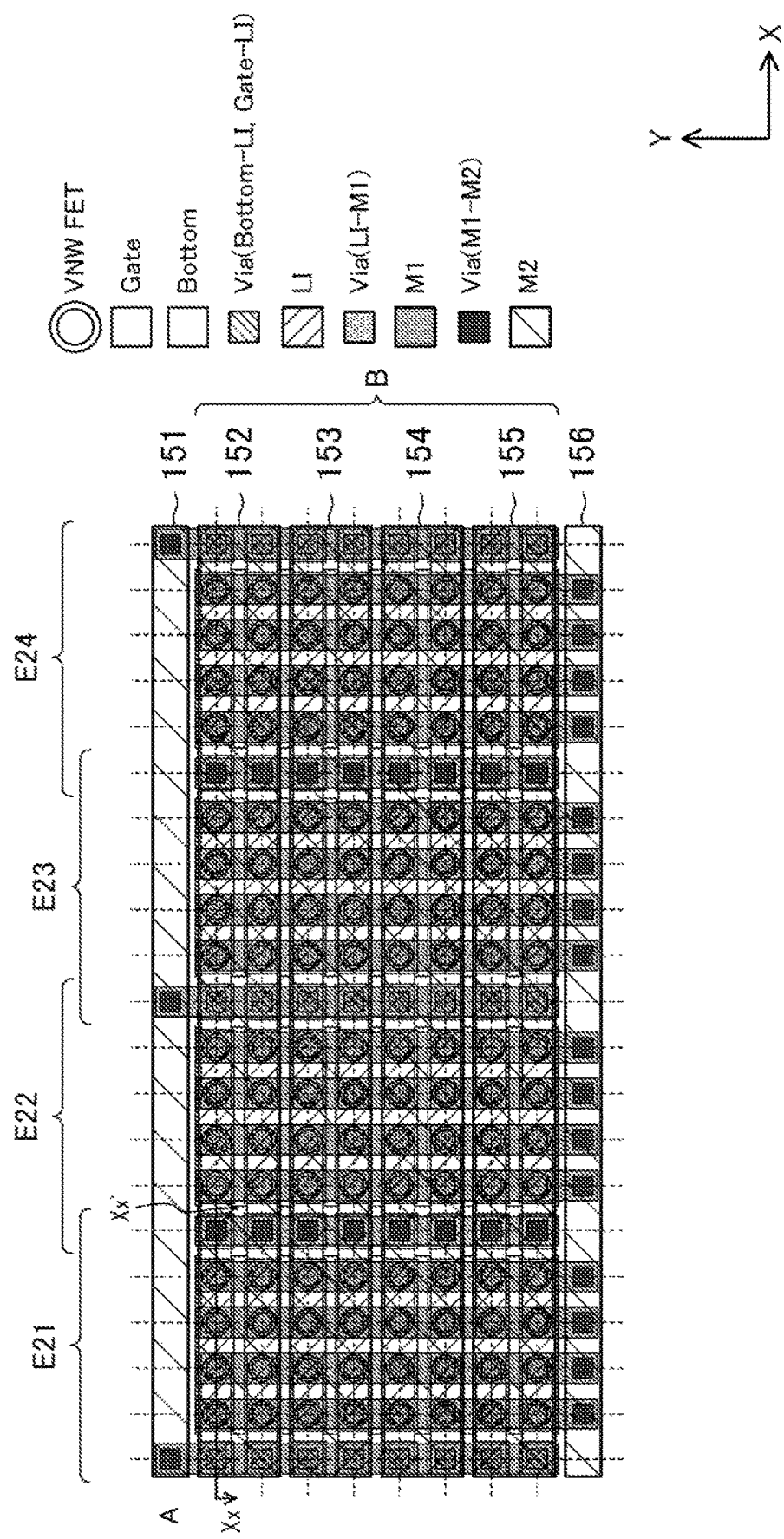
FIG. 14 is an overall plan view showing a layout structure according to the alteration of the second embodiment.
Figure 15:
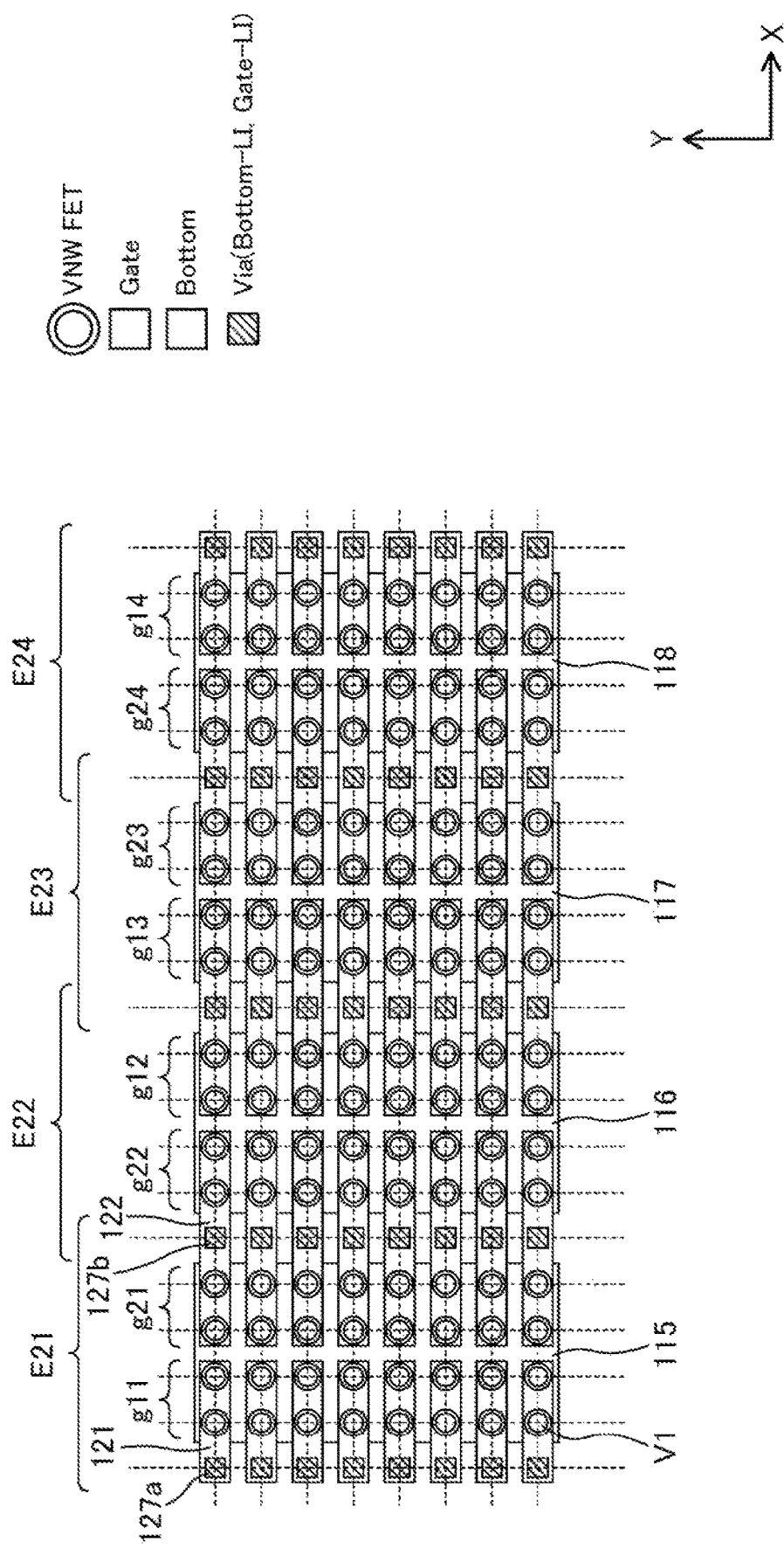
FIG. 15 is a layer-by-layer plan view showing the layout structure according to the alteration of the second embodiment.
Figure 16:
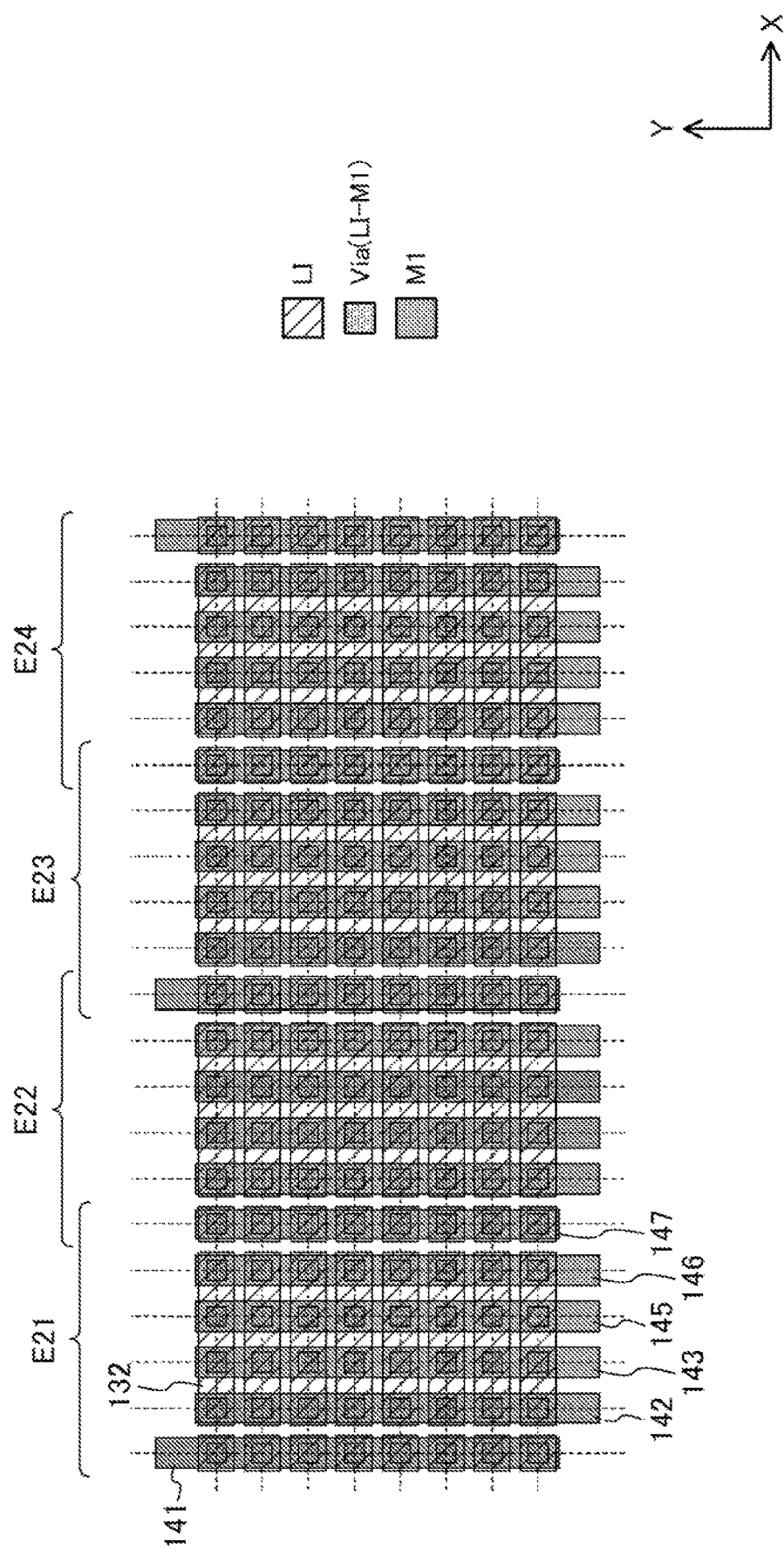
FIG. 16 is a layer-by-layer plan view showing the layout structure according to the alteration of the second embodiment.
Figure 17:
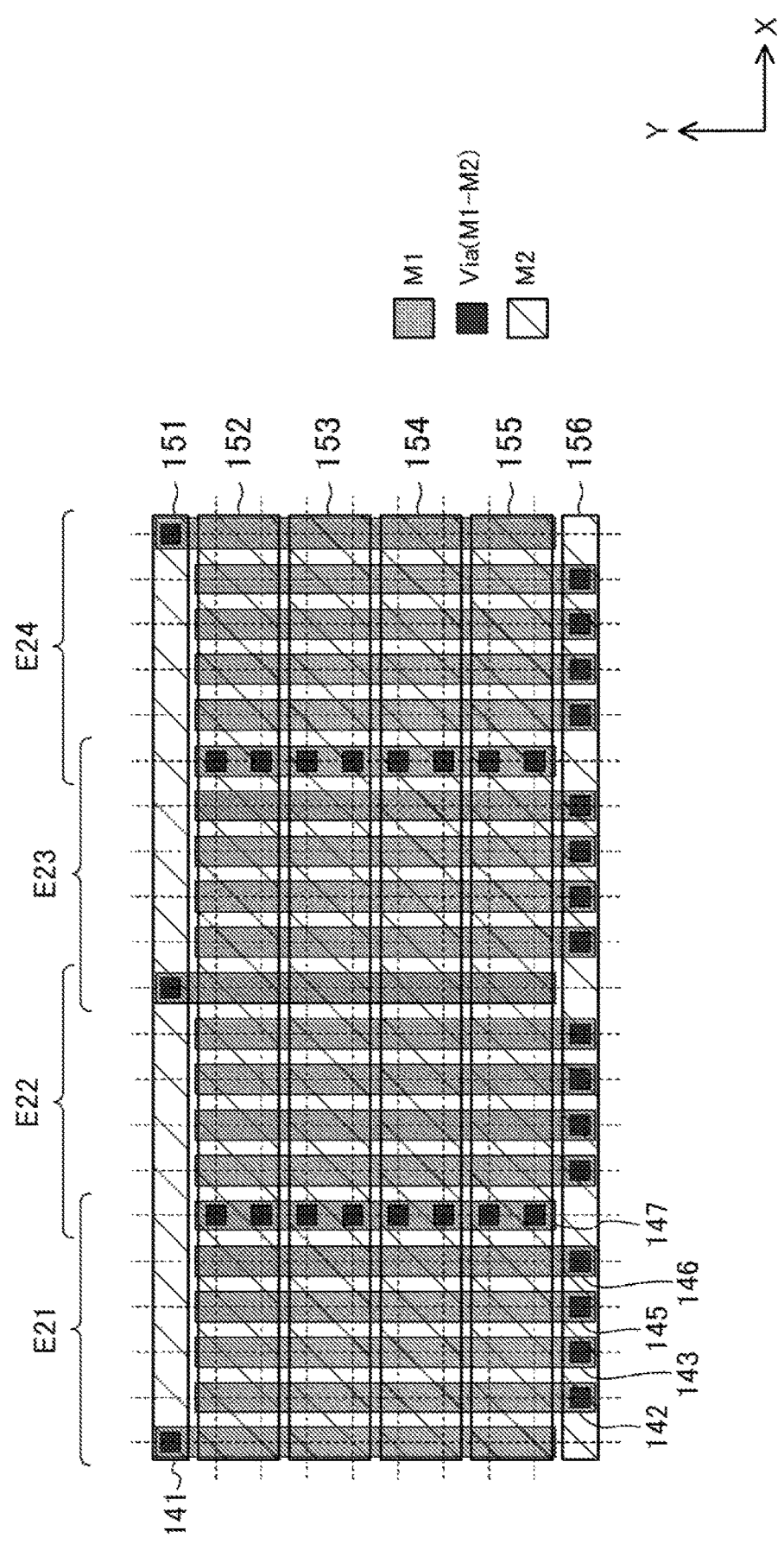
FIG. 17 is a layer-by-layer plan view showing the layout structure according to the alteration of the second embodiment.
Figure 18:
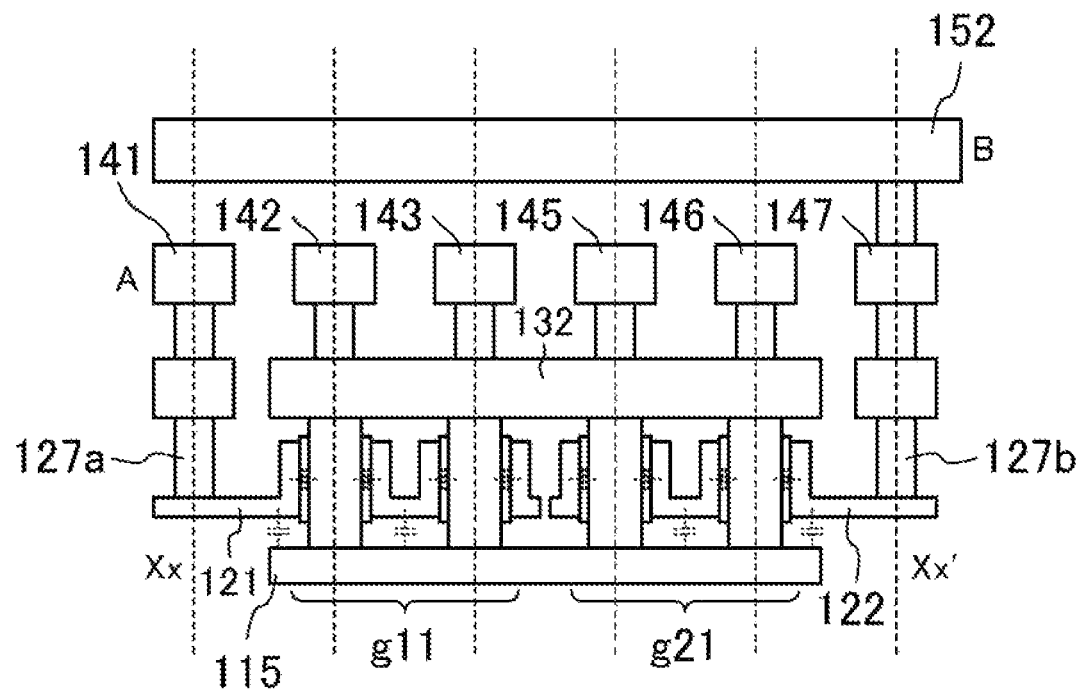
FIG. 18 is a cross-sectional view showing the layout structure according to the alteration of the second embodiment.

FIGS. 14 to 18 are views showing a structure example of the capacitive element according to this alteration, where FIG. 14 is an overall plan view, FIGS. 15 to 17 are layer-by-layer plan views, and FIG. 18 is a cross-sectional view. Specifically, FIG. 15 shows VNW FETs and layers below them, FIG. 16 shows local interconnects and M1 interconnects above the VNW FETs, and FIG. 17 shows the M1 interconnects and M2 interconnects. FIG. 18 is a cross-sectional view taken horizontally as viewed from top in FIG. 14, showing a cross section along line Xx-Xx'.

In the second embodiment described above, in the capacitive element E21, for example, a distance corresponding to one grid spacing is provided between the groups g11 and g21, and the vias 128 are formed on the portion of the bottom region 111 corresponding to this spacing. In this alteration, however, the spacing between the groups g11 and g21 is narrowed, and the vias 128, formed on the bottom region 111, is omitted. The M1 interconnect 144, formed above the vias 128, is also omitted. As a result, the size of the capacitive element E21 in the X direction is reduced by one grid spacing. The size of bottom regions 115, 116, 117, and 118 in the X direction is smaller by one grid spacing than that of the bottom regions 111, 112, 113, and 114 in the second embodiment. Local interconnects 132 are shorter by one grid spacing than the local interconnects 131 in the second embodiment.

That is, the tops and bottoms of VNW FETs V1 of the group g11 are not mutually connected, and the tops and bottoms of VNW FETs V1 of the group g21 are not mutually connected. However, the tops of the VNW FETs V1 of the group g11 and the tops of the VNW FETs V1 of the group g21 are connected through the local interconnects 132, the M1 interconnects 142 to 146, and the M2 interconnect 156. Also, the bottoms of the VNW FETs V1 of the group g11 and the bottoms of the VNW FETs V1 of the group g21 are connected through the bottom region 115.

The other part of the structure of this alteration is similar to that of the second embodiment, and therefore detailed description thereof is omitted here. Having the layout structure described above, functions and advantages similar to those in the second embodiment are obtained. In addition, the layout area of the capacitive element can be made smaller.

Third Embodiment

Figure 19:
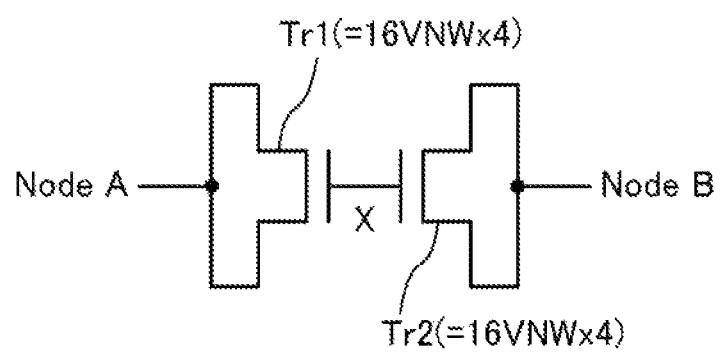
FIG. 19 is a circuit diagram showing a configuration of a capacitive element according to a third embodiment.

FIG. 19 is a circuit diagram showing a configuration of a capacitive element according to the third embodiment. A semiconductor integrated circuit device according to this embodiment includes the capacitive element shown in FIG. 19. The capacitive element of FIG. 19 includes transistors Tr1 and Tr2 placed between node A and node B. The source and drain of the transistor Tr1 are connected with the node A, and the source and drain of the transistor Tr2 are connected with the node B. The gate of the transistor Tr1 and the gate of the transistor Tr2 are mutually connected (node X). Signals are supplied to the nodes A and B, or the nodes A and B are connected with power supply lines. In the latter case, the capacitive element functions as an inter-power supply capacitance.

In the configuration of FIG. 19, the voltage applied to the transistors Tr1 and Tr2 becomes a half of the voltage between the nodes A and B. It is therefore possible to apply a voltage higher than the breakdown voltage of the transistors Tr1 and Tr2 to the capacitive element. Note that the number of transistors provided between the nodes A and B can be more than two.

The transistors Tr1 and Tr2 are constituted by VNW FETs. It is herein assumed that each of the transistors Tr1 and Tr2 is constituted by 16 parallel-connected VNW FETs. In the layout structure according to this embodiment, it is assumed that four capacitive elements, each having 16 VNW FETs constituting the transistor Tr1 and 16 VNW FETs constituting the transistor Tr2, are provided in parallel.

Figure 20:
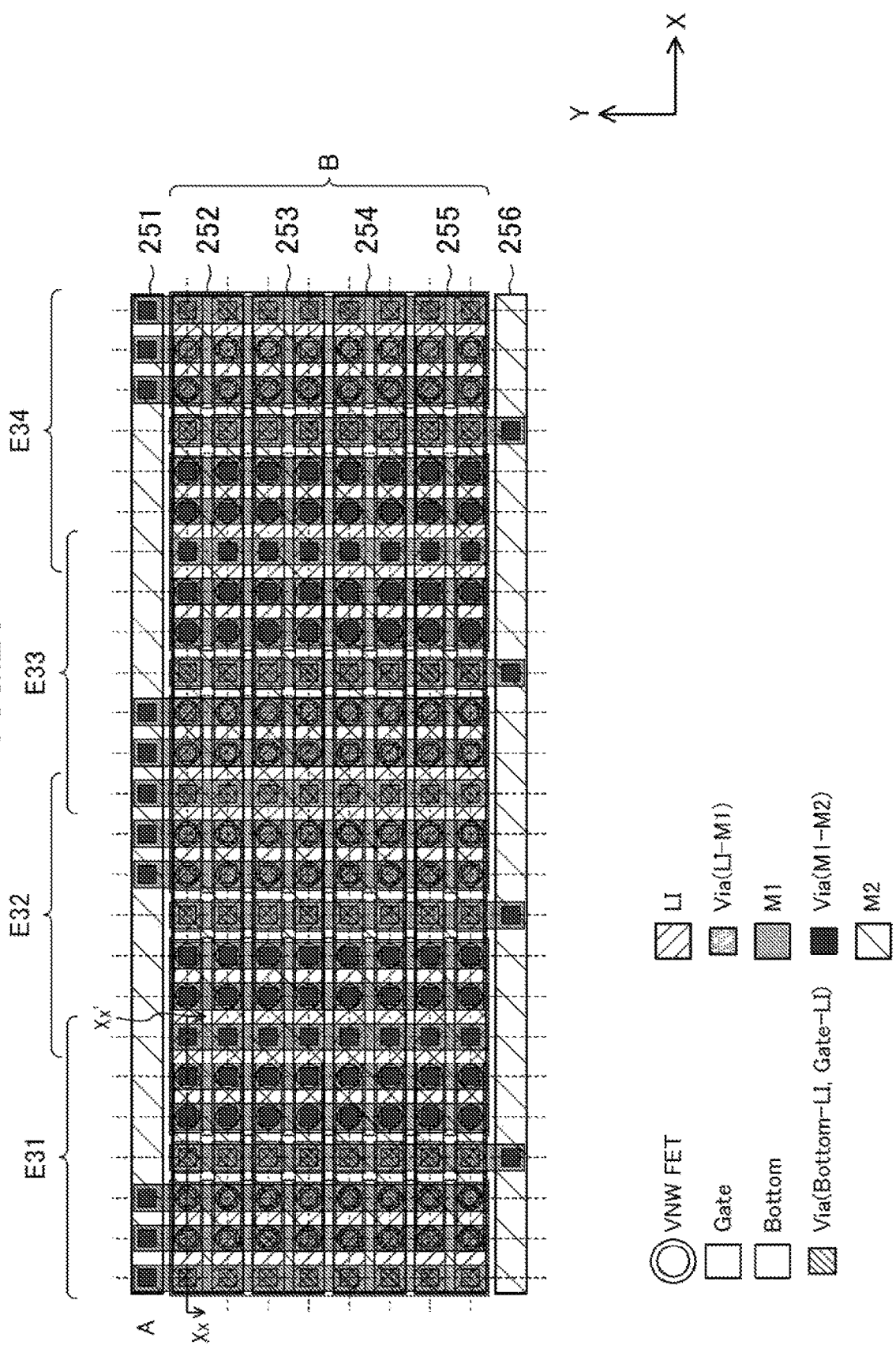
FIG. 20 is an overall plan view showing a layout structure according to the third embodiment.
Figure 21:
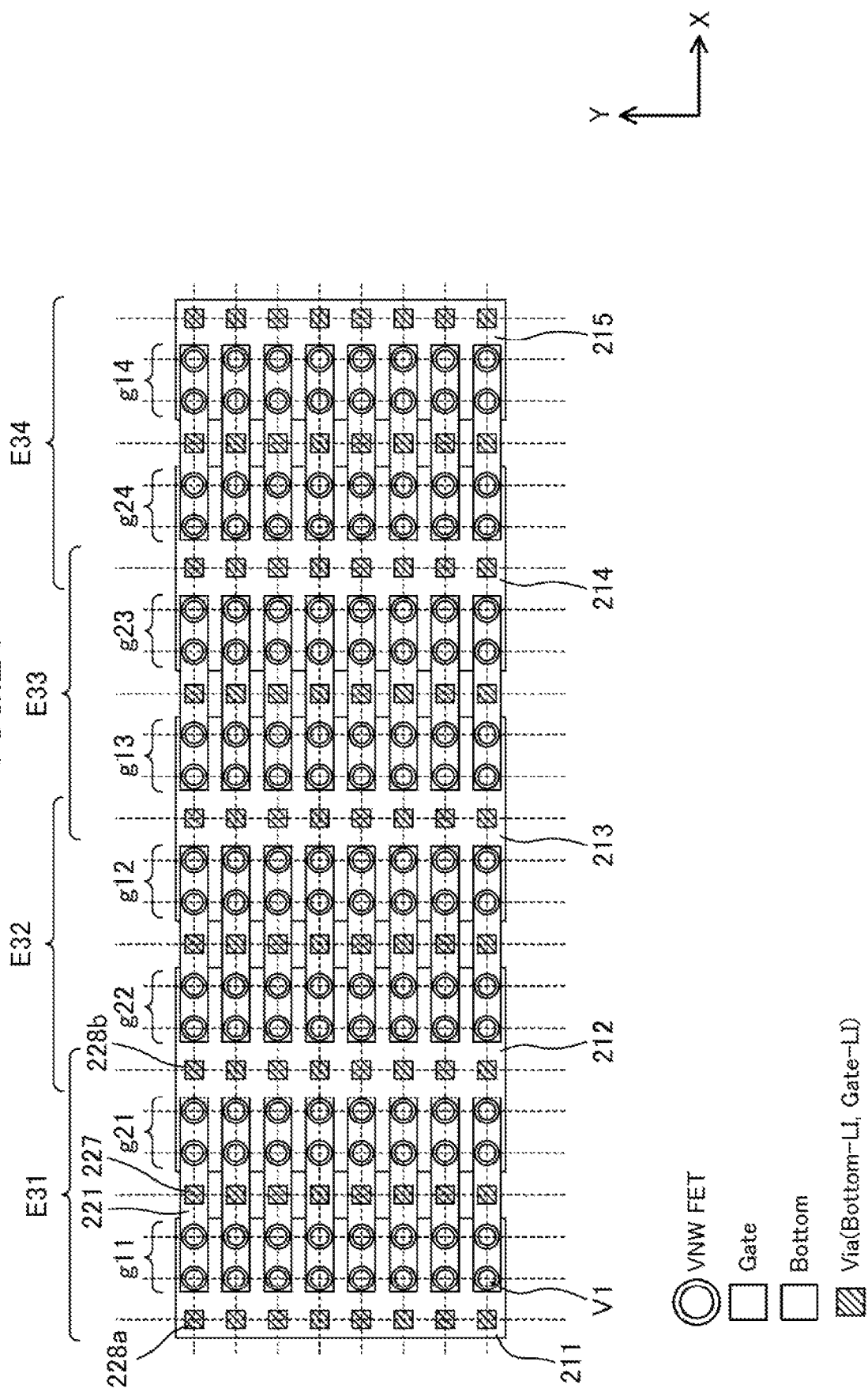
FIG. 21 is a layer-by-layer plan view showing the layout structure according to the third embodiment.
Figure 22:
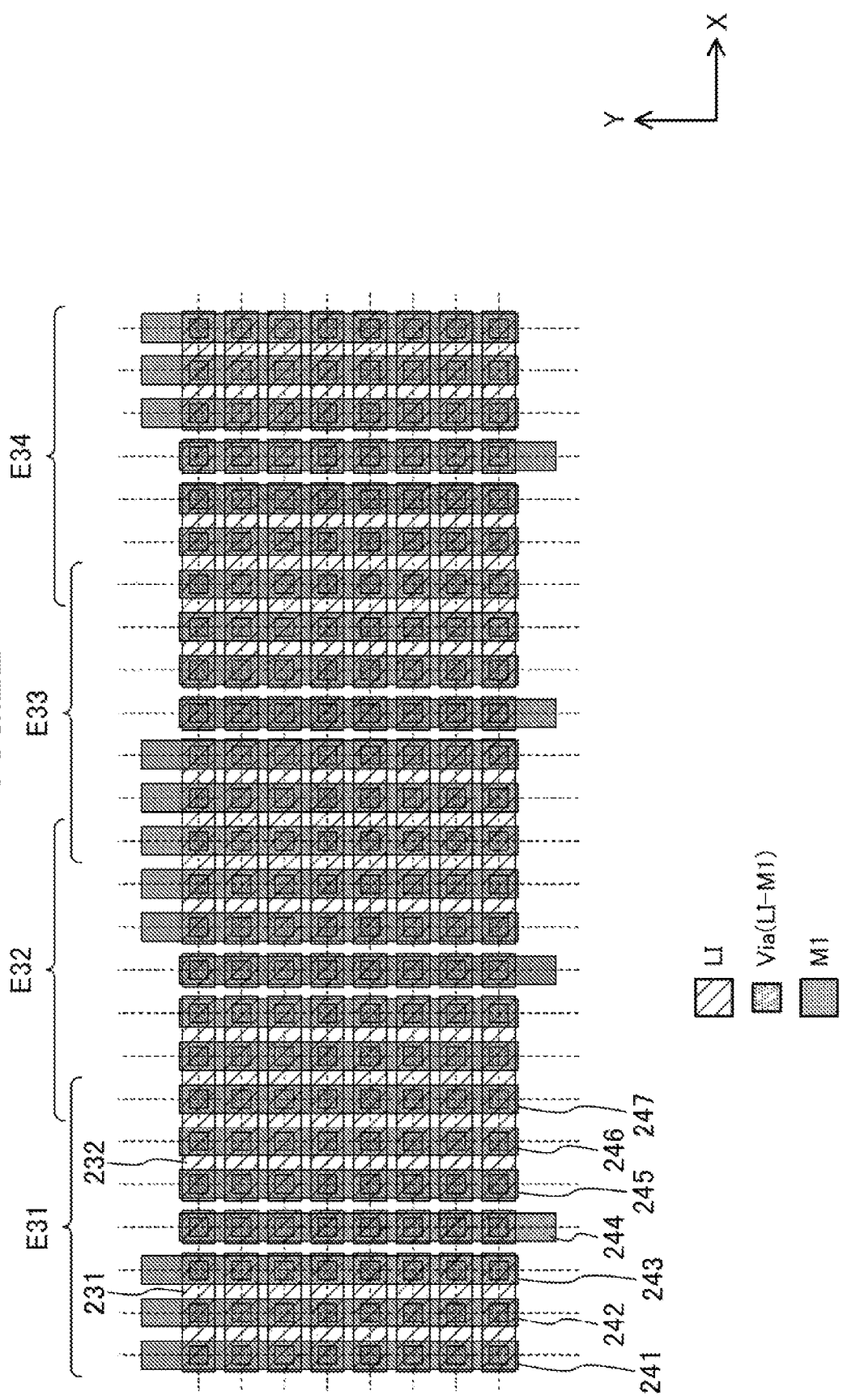
FIG. 22 is a layer-by-layer plan view showing the layout structure according to the third embodiment.
Figure 23:
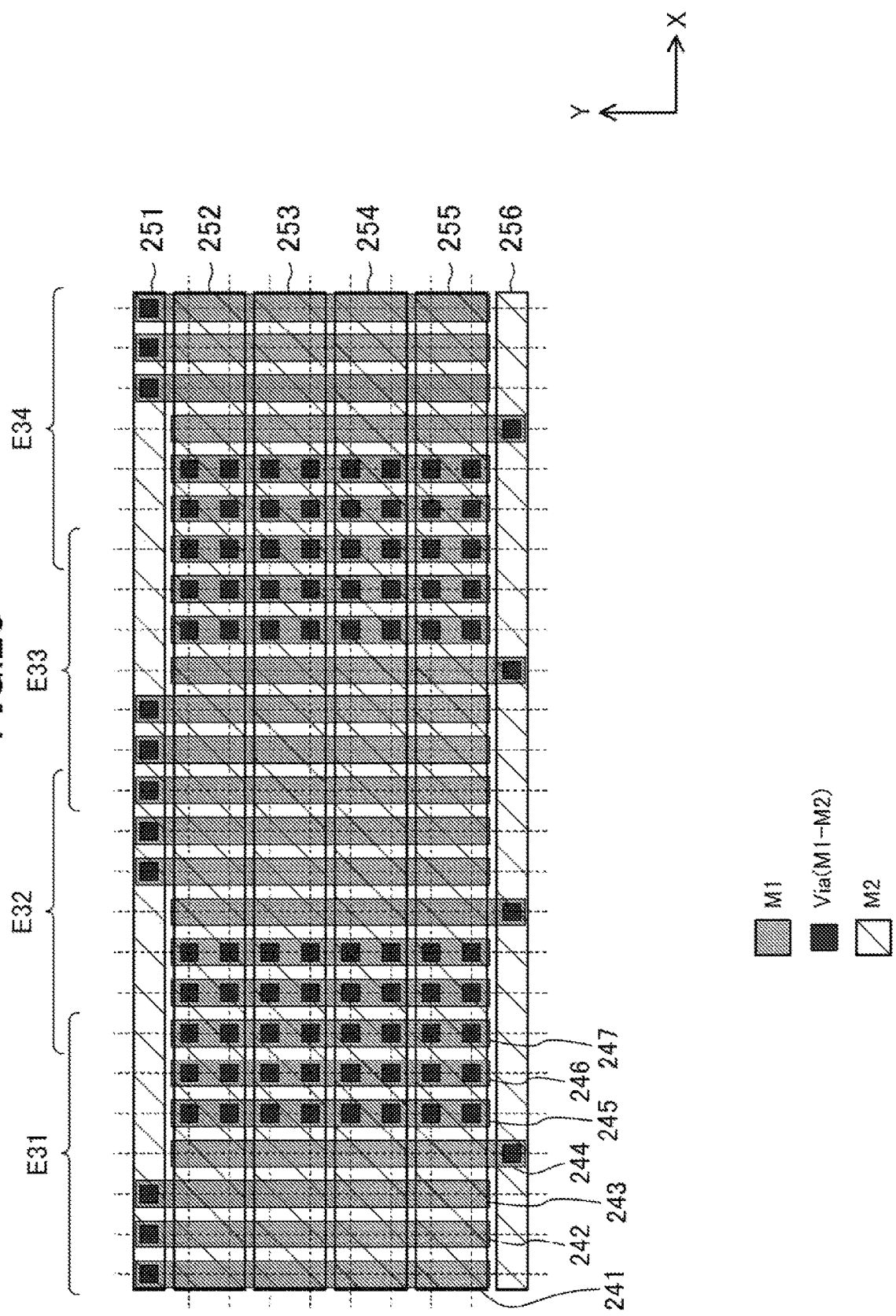
FIG. 23 is a layer-by-layer plan view showing the layout structure according to the third embodiment.
Figure 24:
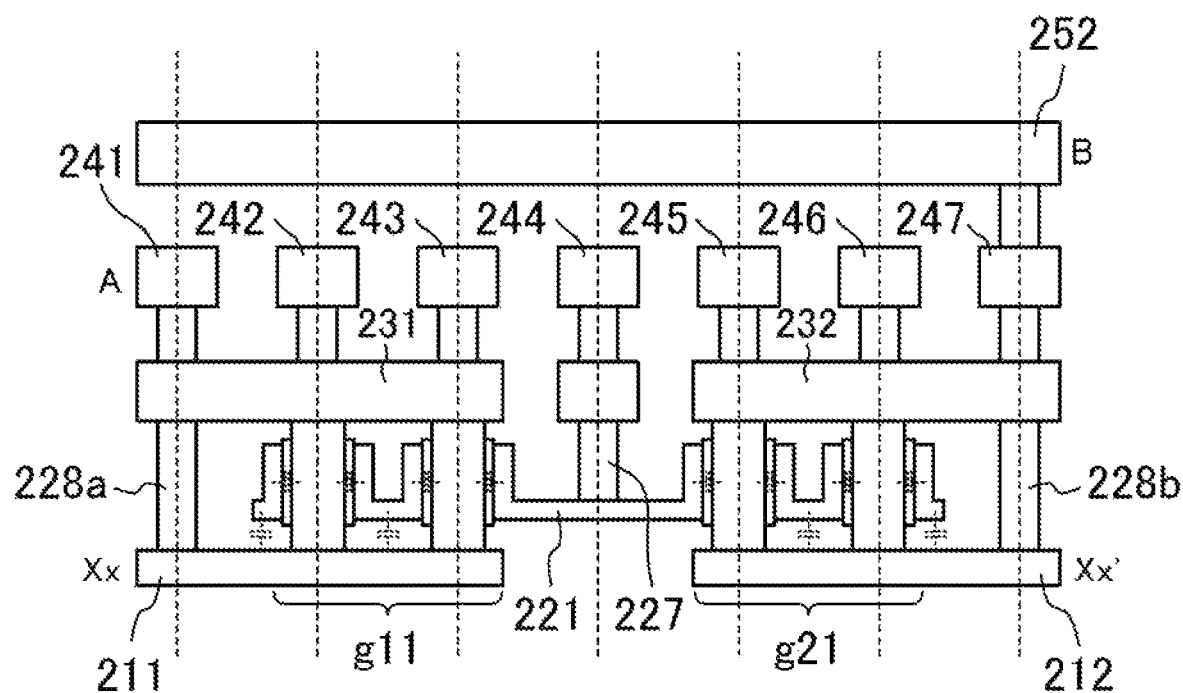
FIG. 24 is a cross-sectional view showing the layout structure according to the third embodiment.

FIGS. 20 to 24 are views showing a structure example of the capacitive element according to this embodiment, where FIG. 20 is an overall plan view, FIGS. 21 to 23 are layer-by-layer plan views, and FIG. 24 is a cross-sectional view. Specifically, FIG. 21 shows VNW FETs and layers below them, FIG. 22 shows local interconnects and M1 interconnects above the VNW FETs, and FIG. 23 shows the M1 interconnects and M2 interconnects. FIG. 24 is a cross-sectional view taken horizontally as viewed from top in FIG. 20, showing a cross section along line Xx-Xx'.

As shown in FIG. 20, etc., M2 interconnects 251, 252, 253, 254, 255, and 256 extending in the X direction are placed: the M2 interconnect 251 corresponds to the node A and the M2 interconnects 252, 253, 254, and 255 correspond to the node B. Capacitive elements E31, E32, E33, and E34 are formed below the M2 interconnects 251 to 256. The capacitive elements E31, E32, E33, and E34 are arranged in the X direction and, in terms of circuitry, provided between the M2 interconnect 251 and the M2 interconnects 252 to 255. The capacitive elements E31 to E34 have basically the same layout shape, although the layout shape of the capacitive elements E32 and E34 is one flipped from that of the capacitive element E31 in the X direction. Also, any adjacent capacitive elements, e.g., the capacitive elements E31 and E32 share a portion of the layout corresponding to one grid spacing.

As shown in FIG. 21, a total of 128 VNW FETs V1 are arranged in an array of 16 columns in the X direction and eight rows in the Y direction, with a spacing provided every two columns in the X direction. Groups of two columns of VNW FETs V1 each are herein denoted by g11, g21, g22, g12, g13, g23, g24, and g14 in this order from the left as viewed from the figure. Each of the groups g11 to g14 and g21 to g24 includes a total of 16 VNW FETs V1 in two columns in the X direction and eight rows in the Y direction.

The groups g11 and g21 respectively constitute the transistors Tr1 and Tr2 of the capacitive element E31. The groups g12 and g22 respectively constitute the transistors Tr1 and Tr2 of the capacitive element E32. The groups g13 and g23 respectively constitute the transistors Tr1 and Tr2 of the capacitive element E33. The groups g14 and g24 respectively constitute the transistors Tr1 and Tr2 of the capacitive element E34. The groups g11 to g14 correspond to the first component, and the groups g21 to g24 correspond to the second component.

Bottom regions 211, 212, 213, 214, and 215 are formed. The VNW FETs V1 of the group g11 are formed on the bottom region 211, and the bottoms thereof are connected with the bottom region 211. The VNW FETs V1 of the groups g21 and g22 are formed on the bottom region 212, and the bottoms thereof are connected with the bottom region 212. The VNW FETs V1 of the groups g12 and g13 are formed on the bottom region 213, and the bottoms thereof are connected with the bottom region 213. The VNW FETs V1 of the groups g23 and g24 are formed on the bottom region 214, and the bottoms thereof are connected with the bottom region 214. The VNW FETs V1 of the group g14 are formed on the bottom region 215, and the bottoms thereof are connected with the bottom region 215.

Taking the capacitive element E31 as an example, the layout structure thereof will be described hereinafter in detail.

In the group g11, the gates of two VNW FETs V1 adjacent in the X direction are mutually connected. In the group g21, the gates of two VNW FETs V1 adjacent in the X direction are mutually connected. In the groups g11 and g21, the gates of four VNW FETs V1 lining up in the X direction are connected with a corresponding gate interconnect 221 extending in the X direction. Vias 227 are formed on portions of the gate interconnects 221 between the groups g11 and g21 for connection with local interconnects formed above. Vias 228a are formed on a portion of the bottom region 211 on the left side of the group g11 as viewed from the figure for connection with local interconnects formed above. Vias 228b are formed on a portion of the bottom region 212 on the right side of the group g21 as viewed from the figure for connection with local interconnects formed above.

Local interconnects 231 extending in the X direction are formed above the group g11. In the group g11, the tops of two VNW FETs V1 adjacent in the X direction are mutually connected through the corresponding local interconnect 231. The local interconnects 231 extend up to the positions of the vias 228a, to be connected with the vias 228a. That is, each of the local interconnects 231 is connected with the tops and bottoms of two VNW FETs V1 of the group g11 adjacent in the X direction.

Local interconnects 232 extending in the X direction are formed above the group g21. In the group g21, the tops of two VNW FETs V1 adjacent in the X direction are mutually connected through the corresponding local interconnect 232. The local interconnects 232 extend up to the positions of the vias 228b, to be connected with the vias 228b. That is, each of the local interconnects 232 is connected with the tops and bottoms of two VNW FETs V1 of the group g21 adjacent in the X direction. Note that each of the local interconnects 232 further extends up to a region above the group g22, to be connected with the tops and bottoms of two VNW FETs V1 of the group g22 adjacent in the X direction.

In an M1 interconnect layer, M1 interconnects 241, 242, 243, 244, 245, 246, and 247 extending in the Y direction are formed above the capacitive element E31. The M1 interconnects 241, 242, and 243 are connected with the local interconnects 231 through vias. The M1 interconnects 241, 242, and 243 are also connected with the M2 interconnect 251 that is to be the node A through vias. That is, the bottoms and tops of the VNW FETs V1 of the group g11 are connected with the M2 interconnect 251, i.e., the node A through the bottom region 211, the vias 228a, the local interconnects 231, and the M1 interconnects 241, 242, and 243.

The M1 interconnect 244 is connected with the gate interconnects 221 through the vias 227 and local interconnects. The M1 interconnect 244 is also connected with the M2 interconnect 256 through a via. That is, the gates of the VNW FETs V1 of the groups g11 and g21 are connected with the M2 interconnect 256 through the gate interconnects 221, the vias 227, and the M1 interconnect 244. The gate interconnects 221 and the M1 interconnect 244 correspond to the node X.

The M1 interconnects 245, 246, and 247 are connected with the local interconnects 232 through vias. The M1 interconnects 245, 246, and 247 are also connected with the M2 interconnects 252 to 255 that are to be the node B through vias. That is, the bottoms and tops of the VNW FETs V1 of the group g21 are connected with the M2 interconnects 252 to 255, i.e., the node B through the bottom region 212, the vias 228b, and the M1 interconnects 245, 246, and 247.

In the cross-sectional view of FIG. 24, examples of locations where a capacitance is generated are shown by dotted lines. That is, a capacitance is generated at a gate oxide film of a VNW FET, and a capacitance is generated between a gate interconnect and a bottom region. Although not illustrated, a capacitance is also generated at other locations such as between a gate interconnect and a top interconnect. With these capacitances, the capacitive element according to this embodiment acquires a large capacitance value.

With the layout structure described above, the capacitive element E31, for example, includes the transistors Tr1 and Tr2: the transistor Tr1 has the group g11 including 16 VNW FETs and the transistor Tr2 has the group g21 including 16 VNW FETs. The groups g11 and g21 are placed side by side in the X direction. The gate interconnects for the group g11 extending toward the group g21 in the X direction are connected with the gate interconnects for the group g21 extending toward the group g11 in the X direction (formed as the single gate interconnects 221 in the illustrated example). Thus, with the gate of the transistor Tr1 being connected with the gate of the transistor Tr2, a capacitive element having a high breakdown voltage is implemented by the transistors Tr1 and Tr2.

Also, in this embodiment, since the single gate interconnects 221 are formed for the groups g11 and g21, that is, the gates of the VNW FETs V1 of the group g11 and the gates of the VNW FETs V1 of the group g21 are directly connected without intervention of contacts or interconnects in another layer, a capacitive element with a smaller layout area can be implemented.

In this embodiment, as is found from the cross-sectional view of FIG. 24, the portion of the capacitive element electrically connected with the node A is sufficiently spaced from the portion thereof electrically connected with the node B. That is, a distance corresponding to one grid spacing is secured between the node B-side ends of the bottom region 211 and the local interconnects 231 connected with the node A and the node A-side ends of the bottom region 212 and the local interconnects 232 connected with the node B. This improves the reliability as the capacitive element.

In the configuration described above, the gate interconnects 221 are formed to extend in the X direction and have the same interconnect width. The local interconnects 231 and 232 are formed to extend in the X direction and have the same interconnect width. The M1 interconnects 241 to 247 are formed to extend in the Y direction and have the same interconnect width. In this way, with the interconnects being the same in direction and width in each interconnect layer, the fabrication becomes easy and the fabrication precision improves. Note that, while the gate interconnects 221, the local interconnects 231 and 232, and the M1 interconnects 241 to 247 appear to be the same in interconnect width in the illustrated configuration, the interconnect width does not need to be the same in different interconnect layers. If only the interconnects are the same in direction and width in one interconnect layer, the fabrication will become easy and the fabrication precision will improve.

While each of the bottom regions 211 to 215 is formed to be continuous in the Y direction in the configuration described above, the bottom region may be formed separately for each of rows of VNW FETs V1 lining up in the X direction. That is, bottom interconnects extending in the X direction may be arranged in the Y direction. Note however that, with the integrally-formed bottom region, a voltage is equally applied to the VNW FETs V1.

While the local interconnects 231 and 232 are formed individually for each of rows of VNW FETs V1 lining up in the X direction in the configuration described above, the local interconnects may be formed to be continuous in the Y direction. Also, M1 interconnects to be connected to a same continuous local interconnect may be formed integrally.

The M2 interconnect 256 may be omitted. In this case, since the nodes X of the capacitive elements E31 to E34 are not mutually connected, they are to be provided individually between the nodes A and B. It is however preferable to provide the M2 interconnect 256 to mutually connect the nodes X of the capacitive elements E31 to E34 because by this connection a voltage is equally applied to the capacitive elements E31 to E34.

<Alteration>

Figure 25:
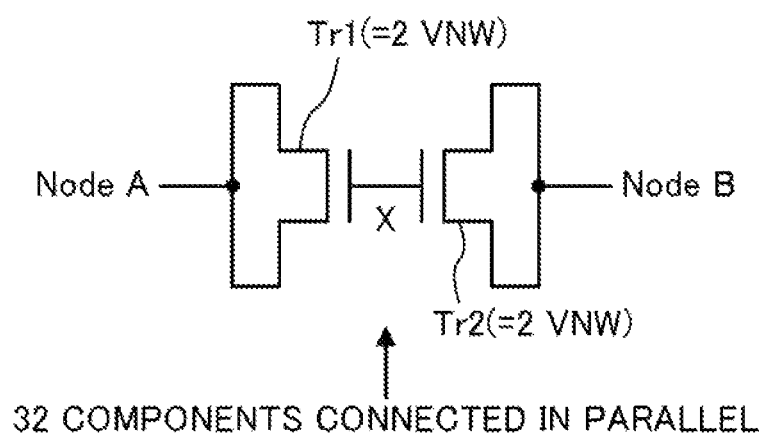
FIG. 25 is a circuit diagram showing a configuration of a capacitive element according to an alteration of the third embodiment.

FIG. 25 is a circuit diagram showing a configuration of a capacitive element according to an alteration of the third embodiment. In the capacitive element of FIG. 25, the gates of the transistors Tr1 and Tr2 are mutually connected. The capacitive element of FIG. 25 is however different from the capacitive element of FIG. 19 in that each of the transistors Tr1 and Tr2 is constituted by two parallel-connected VNW FETs, that the gates of transistors Tr1 are not mutually connected, and that the gates of transistors Tr2 are not mutually connected. That is, in the layout structure according to this alteration, a total of 32 capacitive components each having two VNW FETs constituting the transistor Tr1 and two VNW FETs constituting the transistor Tr2 are provided in parallel.

Figure 26:
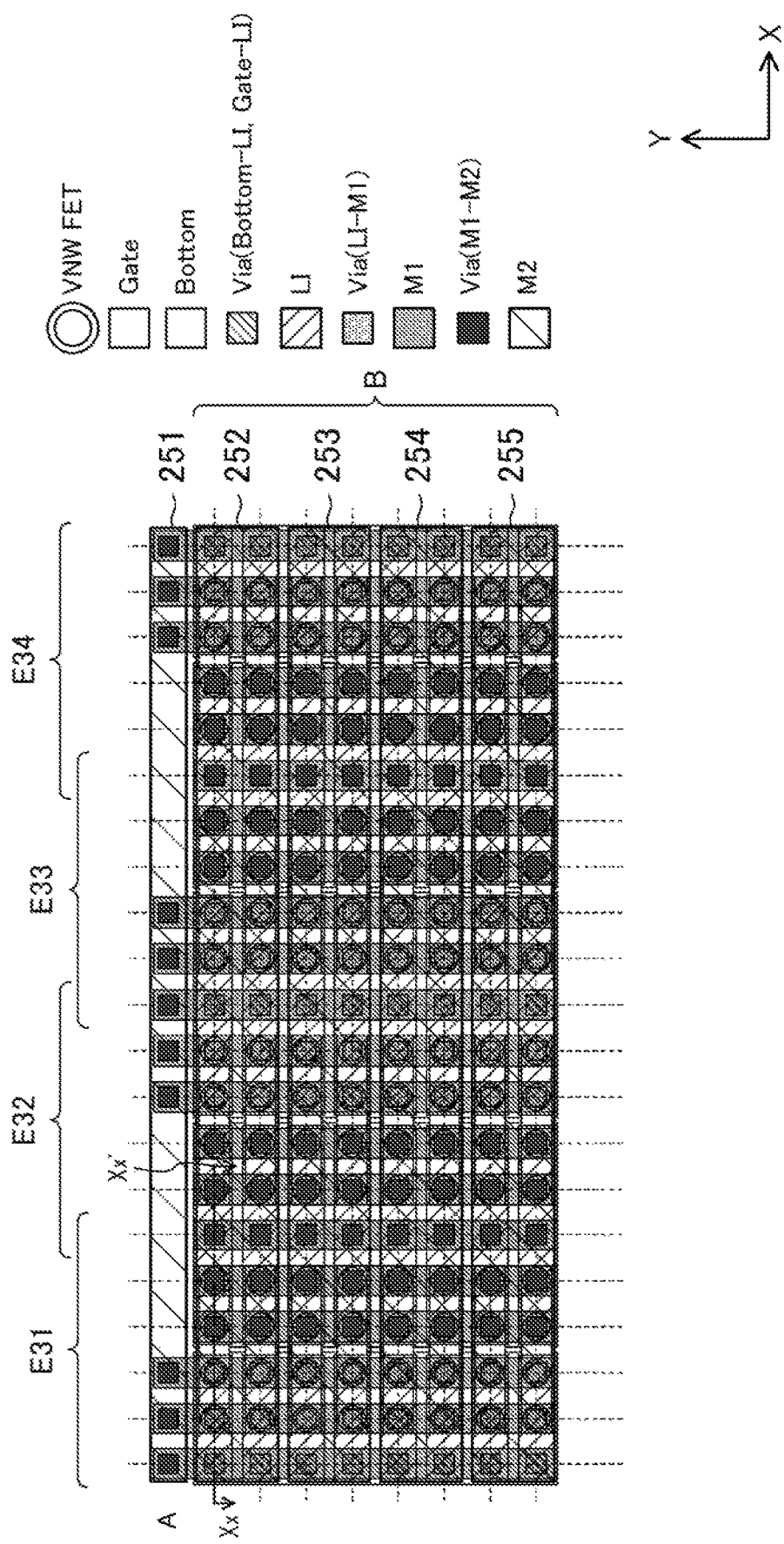
FIG. 26 is an overall plan view showing a layout structure according to the alteration of the third embodiment.
Figure 27:
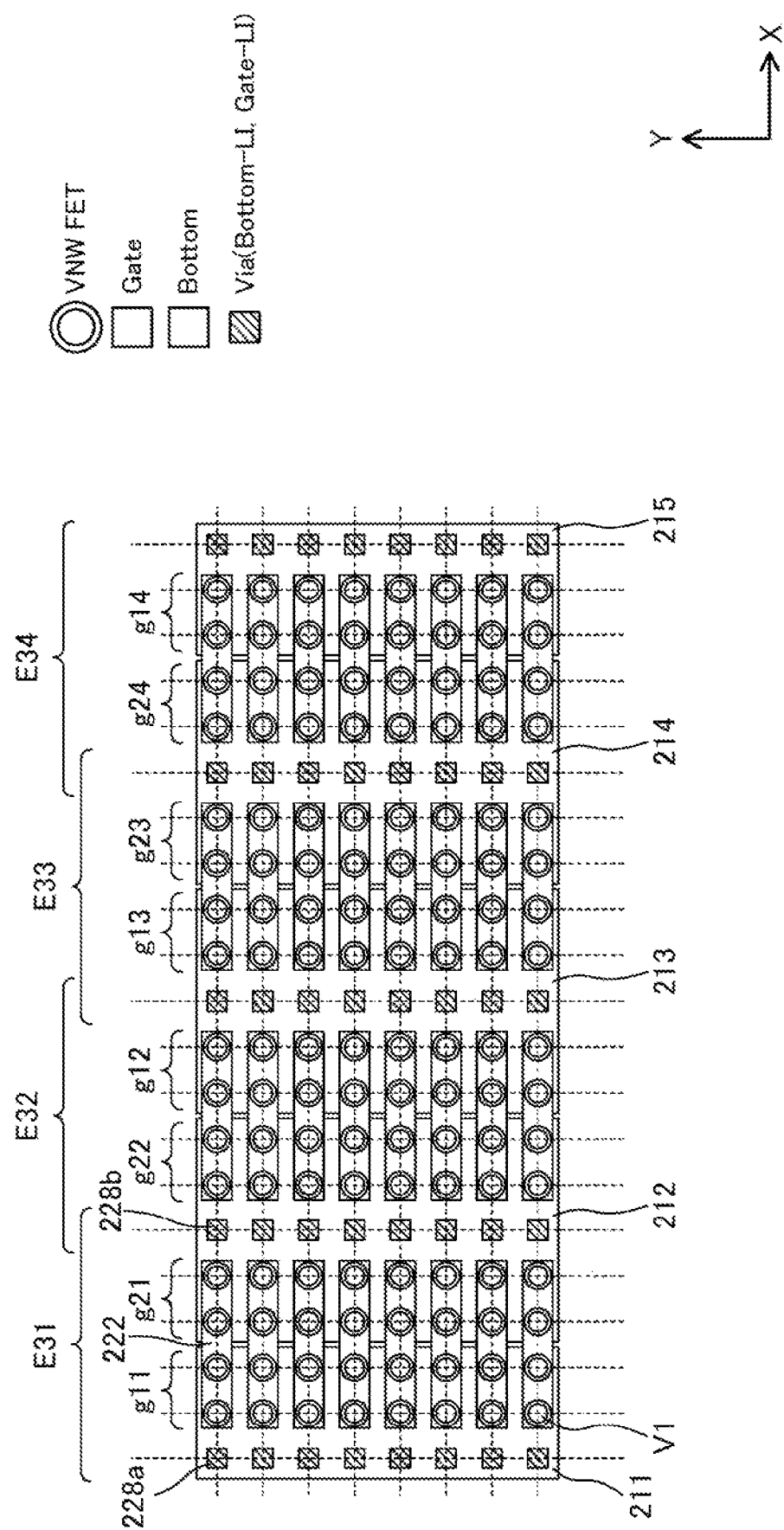
FIG. 27 is a layer-by-layer plan view showing the layout structure according to the alteration of the third embodiment.
Figure 28:
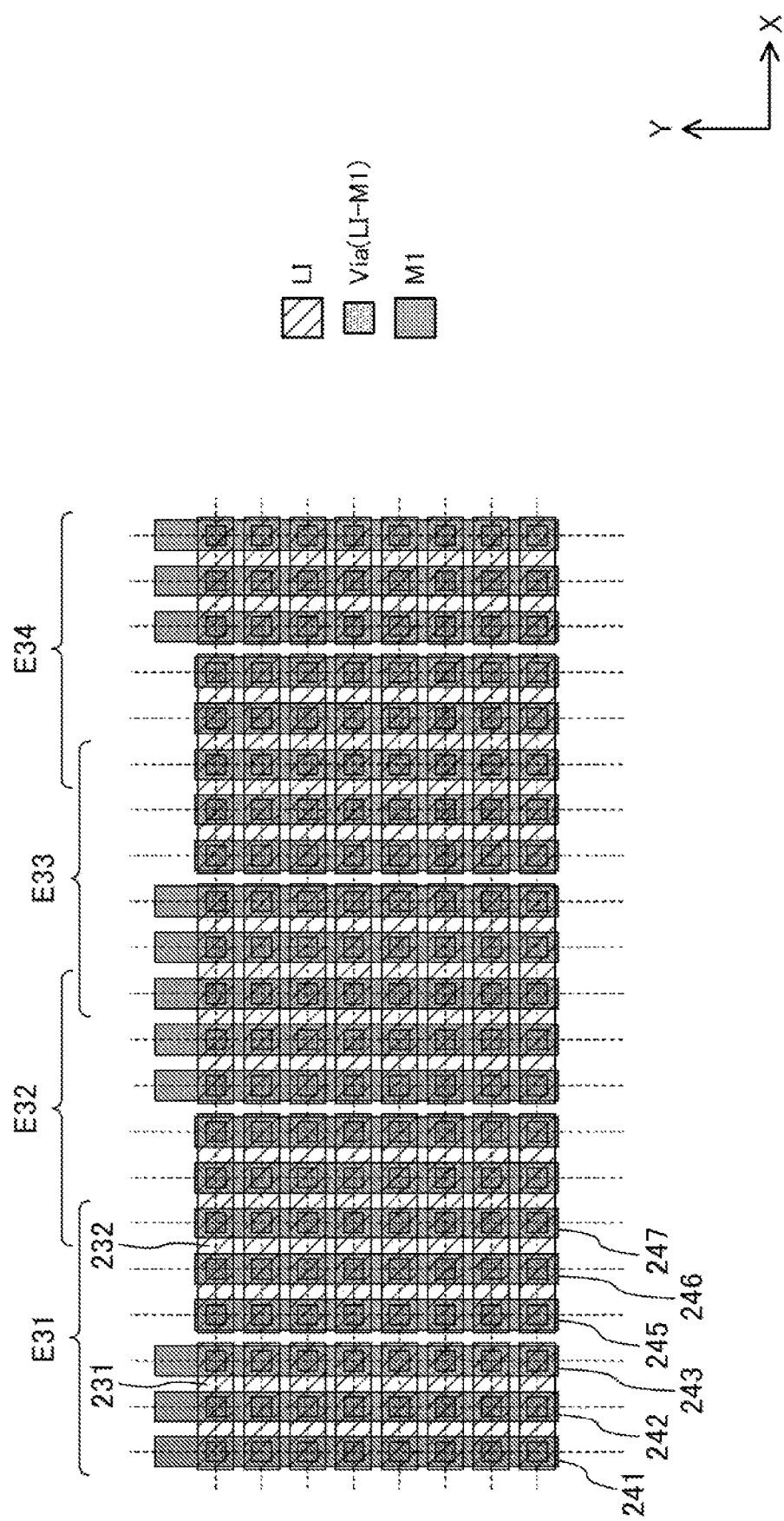
FIG. 28 is a layer-by-layer plan view showing the layout structure according to the alteration of the third embodiment.
Figure 29:
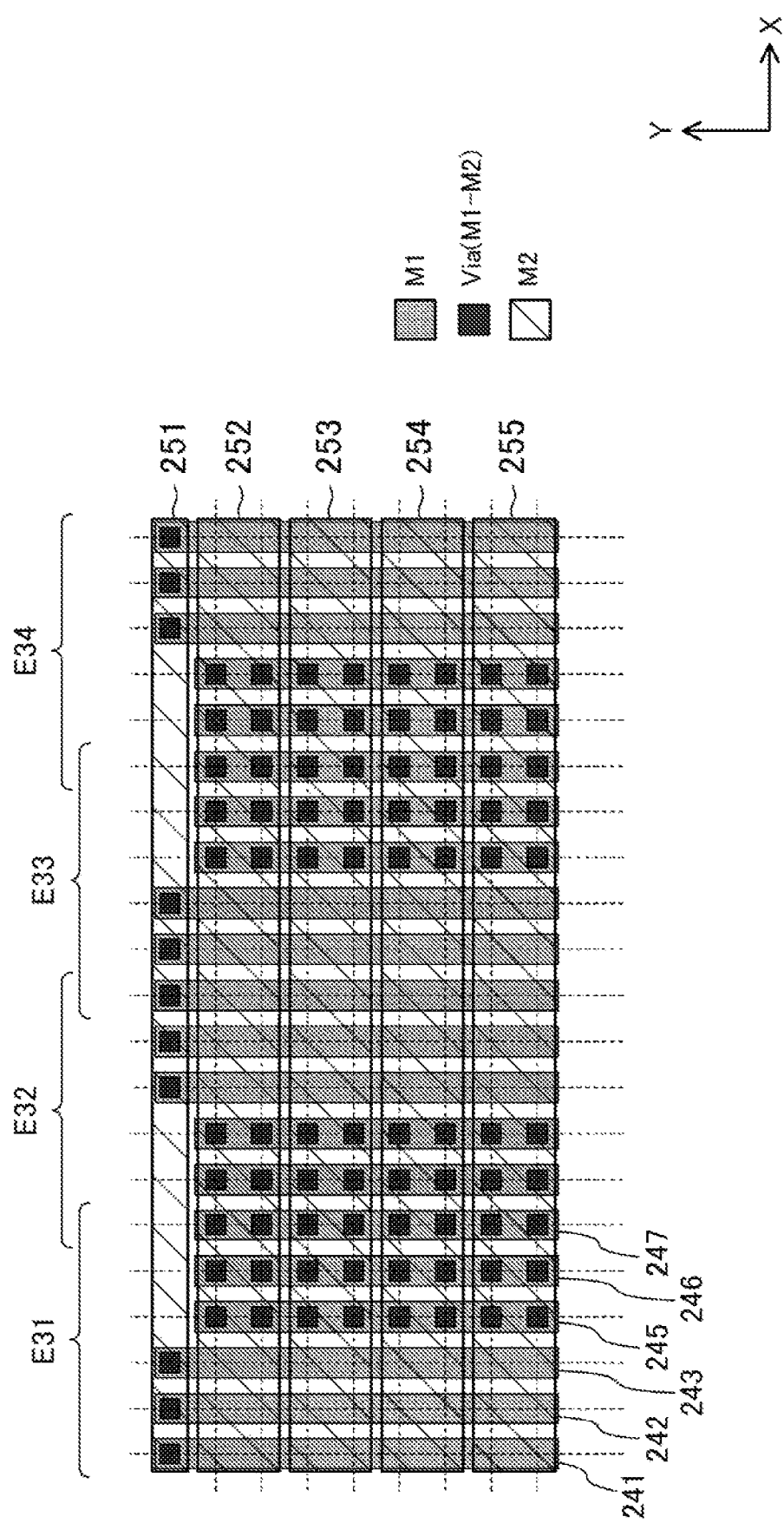
FIG. 29 is a layer-by-layer plan view showing the layout structure according to the alteration of the third embodiment.
Figure 30:
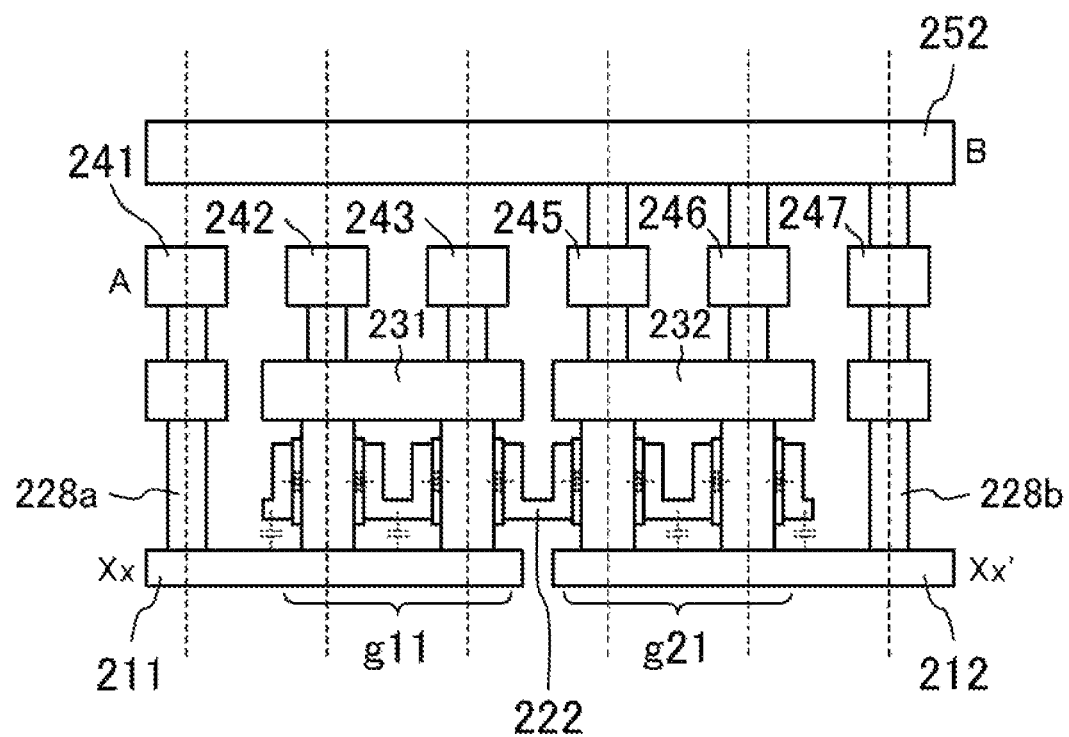
FIG. 30 is a cross-sectional view showing the layout structure according to the alteration of the third embodiment.

FIGS. 26 to 30 are views showing a structure example of the capacitive element according to this alteration, where FIG. 26 is an overall plan view, FIGS. 27 to 29 are layer-by-layer plan views, and FIG. 30 is a cross-sectional view. Specifically, FIG. 27 shows VNW FETs and layers below them, FIG. 28 shows local interconnects and M1 interconnects above the VNW FETs, and FIG. 29 shows the M1 interconnects and M2 interconnects. FIG. 30 is a cross-sectional view taken horizontally as viewed from top in FIG. 26, showing a cross section along line Xx-Xx'.

In FIGS. 26 to 29, each of the capacitive elements E31 to E34 has a configuration where eight capacitive components each having two VNW FETs constituting the transistor Tr1 and two VNW FETs constituting the transistor Tr2 are arranged in the Y direction.

In the third embodiment described above, in the capacitive element E31, for example, a distance corresponding to one grid spacing is provided between the groups g11 and g21, the vias 227 are formed on the portion of the gate interconnects 221 corresponding to this spacing, and the gate interconnects 221 are connected with the M1 interconnects 244 through the vias 227. In this alteration, the spacing between the groups g11 and g21 is narrowed, and no vias are formed on gate interconnects 222. Also, the M1 interconnect 244 is omitted. As a result, the size of the capacitive element E31 in the X direction is reduced by one grid spacing. Further, the M2 interconnect 256 is omitted. The gate interconnects 222 are shorter than the gate interconnects 221 in the third embodiment by one grid spacing.

The other part of the structure of this alteration is similar to that of the third embodiment, and therefore detailed description thereof is omitted here. In this alteration, functions and advantages similar to those in the third embodiment are obtained. In addition, compared to the third embodiment, the layout area of the capacitive element can be made smaller.

Other Embodiments (No. 1)

In the layout structure examples described above, a total of 16 VNW FETs V1 are provided in two columns in the X direction and eight rows in the Y direction in each of the groups g11 to g14 and g21 to g24. The number of VNW FETs and the numbers of columns and rows of VNW FETs are not limited to these. For example, a total of four VNW FETs V1 in one column in the X direction and four rows in the Y direction may be provided in each group.

(No. 2)

While the planar shape of the VNWs is a circle in the layout structure examples described above, it is not limited to a circle. For example, the planar shape of the VNWs can be a rectangle or an oval. When the planar shape of the VNWs is a shape extending long in one direction like an oval, the direction of the extension is preferably uniform. Also, the positions of the ends are preferably aligned.

In the capacitive elements, all VNWs do not need to have the same shape, but VNWs having different planar shapes may be present in a mixed manner. For example, circular VNWs and oval VNWs may be present in a mixed manner.

According to the present disclosure, capacitive elements having a high breakdown voltage can be implemented using VNW FETs. The present disclosure is therefore useful for improvement in the performance of semiconductor chips, for example.

What is claimed is:

1. A semiconductor integrated circuit device comprising a capacitive element,
   wherein
   the capacitive element includes a first transistor and a second transistor,
   the first transistor has a first component including one vertical nanowire (VNW) FET or a plurality of VNW FETs arranged in a first direction with gates, tops, and bottoms of the VNW FETs being independently connected with each other,
   the second transistor has a second component including one VNW FET or a plurality of VNW FETs arranged in the first direction with gates, tops, and bottoms of the VNW FETs being independently connected with each other,
   the first component and the second component are placed side by side in the first direction,
   the first component includes
      a first gate interconnect connected with the gate of the VNW FET, extending from the VNW FET away from the second component in the first direction,
      a first top interconnect connected with the top of the VNW FET, extending from the VNW FET toward the second component in the first direction, and
      a first bottom interconnect connected with the bottom of the VNW FET, extending from the VNW FET toward the second component in the first direction,
   the second component includes a second gate interconnect connected with the gate of the VNW FET, extending from the VNW FET toward the first component in the first direction, a second top interconnect connected with the top of the VNW FET, extending from the VNW FET away from the first component in the first direction, and a second bottom interconnect connected with the bottom of the VNW FET, extending from the VNW FET away from the first component in the first direction, and the first top interconnect, the first bottom interconnect, and the second gate interconnect are connected.

2. The semiconductor integrated circuit device of claim 1, wherein
the first top interconnect is connected with a metal interconnect extending in a second direction perpendicular to the first direction.

3. A semiconductor integrated circuit device comprising a capacitive element,
wherein
the capacitive element includes a first transistor and a second transistor,
the first transistor has a first component including one vertical nanowire (VNW) FET or a plurality of VNW FETs arranged in a first direction with gates, tops, and bottoms of the VNW FETs being independently connected with each other,
the second transistor has a second component including one VNW FET or a plurality of VNW FETs arranged in the first direction with gates, tops, and bottoms of the VNW FETs being independently connected with each other,
the first component and the second component are placed side by side in the first direction,
the first component includes
a first gate interconnect connected with the gate of the VNW FET, extending from the VNW FET away from the second component in the first direction,
a first top interconnect connected with the top of the VNW FET, extending from the VNW FET toward the second component in the first direction, and
a first bottom interconnect connected with the bottom of the VNW FET, extending from the VNW FET toward the second component in the first direction,
the second component includes
a second gate interconnect connected with the gate of the VNW FET, extending from the VNW FET away from the first component in the first direction,
a second top interconnect connected with the top of the VNW FET, extending from the VNW FET toward the first component in the first direction, and
a second bottom interconnect connected with the bottom of the VNW FET, extending from the VNW FET toward the first component in the first direction, and
the first top interconnect and the second top interconnect are connected, and the first bottom interconnect and the second bottom interconnect are connected.

4. The semiconductor integrated circuit device of claim 3, wherein
the first and second top interconnects are connected with the first and second bottom interconnects.

5. The semiconductor integrated circuit device of claim 3, wherein
the first and second top interconnects are formed as a single interconnect.

6. The semiconductor integrated circuit device of claim 3, wherein
the first and second top interconnects are connected with a metal interconnect extending in a second direction perpendicular to the first direction.

7. The semiconductor integrated circuit device of claim 3, wherein
the first and second bottom interconnects are formed as a single bottom region.

8. A semiconductor integrated circuit device comprising a capacitive element,
wherein
the capacitive element includes a first transistor and a second transistor,
the first transistor has a first component including one vertical nanowire (VNW) FET or a plurality of VNW FETs arranged in a first direction with gates, tops, and bottoms of the VNW FETs being independently connected with each other,
the second transistor has a second component including one VNW FET or a plurality of VNW FETs arranged in the first direction with gates, tops, and bottoms of the VNW FETs being independently connected with each other,
the first component and the second component are placed side by side in the first direction,
the first component includes
a first gate interconnect connected with the gate of the VNW FET, extending from the VNW FET toward the second component in the first direction,
a first top interconnect connected with the top of the VNW FET, extending from the VNW FET away from the second component in the first direction, and
a first bottom interconnect connected with the bottom of the VNW FET, extending from the VNW FET away from the second component in the first direction,
the second component includes
a second gate interconnect connected with the gate of the VNW FET, extending from the VNW FET toward the first component in the first direction,
a second top interconnect connected with the top of the VNW FET, extending from the VNW FET away from the first component in the first direction, and
a second bottom interconnect connected with the bottom of the VNW FET, extending from the VNW FET away from the first component in the first direction, and
the first gate interconnect and the second gate interconnect are connected.

9. The semiconductor integrated circuit device of claim 8, wherein
the first and second gate interconnects are formed as a single interconnect.

10. The semiconductor integrated circuit device of claim 8, wherein
the first and second gate interconnects are connected with a metal interconnect extending in a second direction perpendicular to the first direction.

* * * * *